United States Patent [19]
Barrett

[11] Patent Number: 5,440,193
[45] Date of Patent: Aug. 8, 1995

[54] METHOD AND APPARATUS FOR STRUCTURAL, ACTUATION AND SENSING IN A DESIRED DIRECTION

[75] Inventor: Ronald M. Barrett, Auburn, Ala.

[73] Assignee: University of Maryland, College Park, Md.

[21] Appl. No.: 43,988

[22] Filed: Apr. 7, 1993

Related U.S. Application Data

[63] Continuation-in-part of Ser. No. 790,074, Nov. 12, 1991, abandoned, which is a continuation of Ser. No. 485,599, Feb. 27, 1990, abandoned.

[51] Int. Cl.$^6$ ............... B29C 65/52; H01L 41/053
[52] U.S. Cl. ............................. 340/328; 73/775; 156/291; 310/348
[58] Field of Search .............. 156/291, 293; 310/321, 310/328, 333, 352, 368, 348; 73/767, 768, 775, 777, 779, 802, DIG. 2, DIG. 4; 244/75 R

[56] References Cited

U.S. PATENT DOCUMENTS

| | | | |
|---|---|---|---|
| 2,558,563 | 6/1951 | Janssen | 73/775 |
| 2,735,025 | 2/1956 | Wiggins | 310/328 |
| 2,782,397 | 2/1957 | Young | 310/358 |
| 2,920,480 | 1/1960 | Haas | 73/787 |
| 3,136,154 | 6/1964 | Christensen | 73/775 |
| 3,184,962 | 5/1965 | Gay | 73/775 |
| 3,401,377 | 9/1968 | Bartlett et al. | 310/328 |
| 3,462,746 | 8/1969 | Bartlett | 310/328 |
| 3,786,679 | 1/1974 | Crites | 73/775 |
| 3,863,250 | 1/1975 | McCluskey | 310/328 |
| 4,725,020 | 2/1988 | Whitener | 244/76 R |
| 4,793,189 | 12/1988 | Dell'Orto et al. | 73/775 |
| 4,857,791 | 8/1989 | Uchino et al. | 310/328 |
| 4,868,447 | 9/1989 | Lee et al. | 310/328 |
| 5,331,241 | 7/1994 | Itoh | 310/328 |
| 5,359,494 | 10/1994 | Morimoto | 310/348 |

FOREIGN PATENT DOCUMENTS

| | | | |
|---|---|---|---|
| 1149636 | 4/1969 | United Kingdom | 73/767 |
| 12953 | 9/1991 | WIPO | 156/291 |

OTHER PUBLICATIONS

IBM Technical Disclosure Bulletin, vol. 14, No. 5, Oct. 1971, 310–328.

*Primary Examiner*—Steven D. Maki
*Attorney, Agent, or Firm*—Oblon, Spivak, McClelland, Maier & Neustadt

[57] ABSTRACT

An apparatus, system and method for actuating or sensing strains in a substrate which includes at least one actuator/sensor element which has transverse and longitudinal axes. The actuator/sensor element is attached to the substrate in such a manner that the stiffness of the actuator/sensor element differs in the transverse and longitudinal axes. In this manner, it is possible to sense or actuate strains in the substrate in a desired direction, regardless of the passive stiffness properties of the substrate, actuator element or sensor element. An isotropic actuator/sensor element attached to a substrate in this manner can then operate in an anisotropic way. In a preferred embodiment, the actuator/sensor element is bonded to the substrate at an area of attachment occupying only the central third of the actuator/sensor element in its longitudinal axes. The actuator/sensor element may be a piezoelectric, magnetostrictive, thermally actuated lamina (including bi-metallic) or shape memory alloy element.

20 Claims, 15 Drawing Sheets

FIG. 2A  FIG. 2B  FIG. 2C  FIG. 2D
 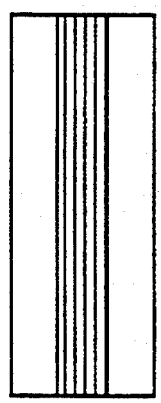 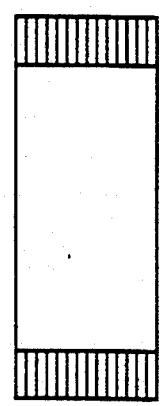 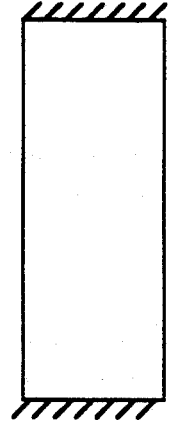
FIG. 2E  FIG. 2F  FIG. 2G  FIG. 2H
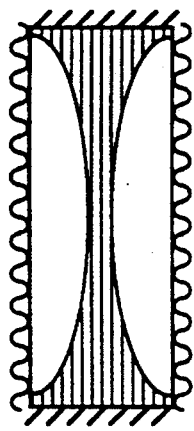 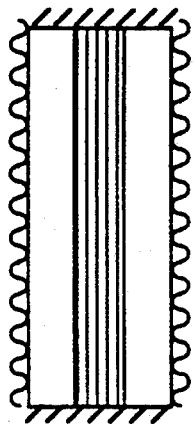 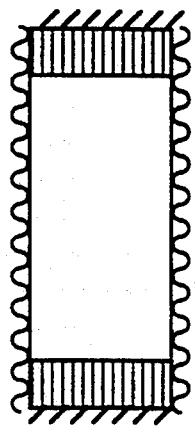 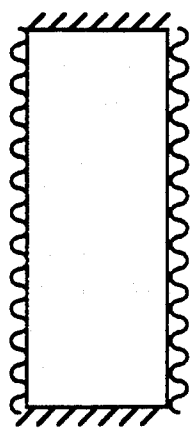
FIG. 2I
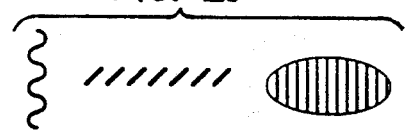

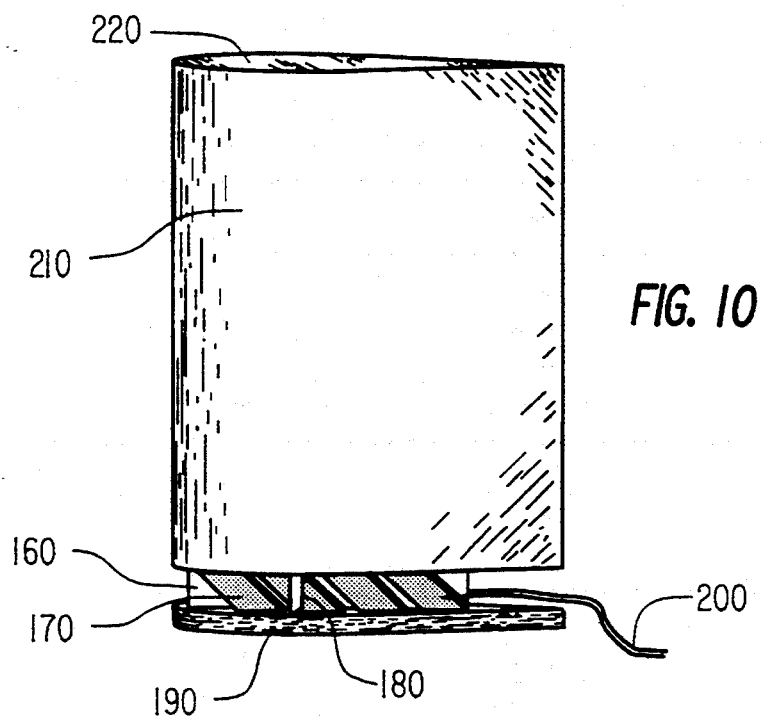
FIG. 10
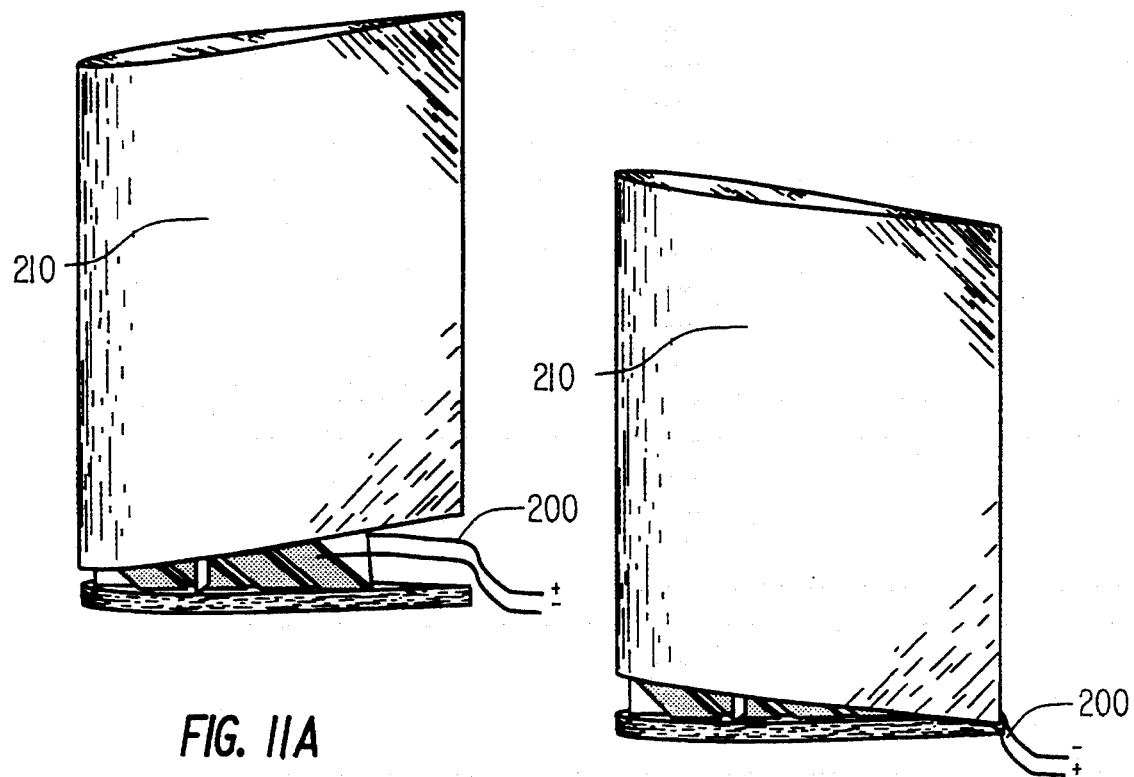
FIG. 11A
FIG. 11B

METHOD AND APPARATUS FOR STRUCTURAL, ACTUATION AND SENSING IN A DESIRED DIRECTION

This application is a Continuation-In-Part of application Ser. No. 07/790,074, filed on Nov. 12, 1991, now abandoned, which is a continuation of Ser. No. 07/485,599, filed on Feb. 27, 1990, now abandoned.

BACKGROUND OF THE INVENTION

1. Field of the Invention

The present invention is directed to the directional attachment of an actuator/sensor to a substrate. More specifically, the present invention is directed to the directional attachment of an actuator/sensor to a substrate such that it is possible to actuate/sense strains in the substrate in a desired direction, regardless of the passive stiffness properties of the substrate, actuator element, or sensor element.

2. Discussion of Background

Currently, a structure can only be actuated by a piezoelectric, magnetostrictive, thermally actuated lamina (including bi-metallic) or shape memory alloy (SMA) elements isotropically, which means that a twist or torsional deflection can be produced in the structure if and only if it is fully attached and extension-twist or bending-twist coupled. The same holds true for sensing; currently, a structure must be fully attached and extension-twist coupled or bending-twist coupled to piezoelectric, magnetostrictive, thermally actuated lamina (including bi-metallic) or shape memory alloy (SMA) sensors aligned to sense the twist through the amount of extension or bending. FIG. 7 shows two fully attached actuator/sensor elements 10 attached to a substrate 30 in a bending-twist coupled arrangement. FIG. 8 shows two fully attached actuator/sensor elements 10 attached to a substrate 30 in an extension twist coupled arrangement. Thus, these arrangements do not allow twist or torsional deflections in a substrate to be actuated or sensed regardless of the passive structural properties of the substrate.

Coupling actuator/sensor elements to structures has been shown to be particularly useful in controlling and reducing vibration in several types of aeronautical and aerospace structures. Applications include vibration suppression in space trusses, dynamic control of camber and twist for gust alleviation and flutter suppression on fixed wing surfaces. Vibration suppression in rotorcraft could also be enhanced through the use of intelligent actuators because current methods of vibration reduction in rotorcraft or helicopters do not address some of the vibration inducing phenomena that occur in actual helicopters including differences in individual blade tracking and magnitude and locations of dynamic stall. Because the unsteady bending moments in a rotor blade are several orders of magnitude greater than present intelligent actuators can impart, direct manipulation of the rotor blade and bending is currently not feasible. However, through blade twist manipulation many types of vibration reduction methods can be employed including suppression of blade vibrational modes, in flight tracking and dynamic stall reduction through small amplitude pitch oscillation, as well as higher harmonic control (HHC) and individual blade control (IBC).

Implementation of dynamic blade twist requires the introduction of torsional forcing to orthotropic or quasi-orthotropic blade structures such as uncoupled composite or aluminum blades. Since nearly all composite rotor blades in use today have such characteristics, a method of torsional forcing must be developed. Many types of intelligent actuation devices, including piezoelectric actuators, in production today are incapable of imparting this torsional forcing due to their quasi-isotropic nature. Therefore, these systems do not allow the coupling of actuators/sensors to rotor blades in such a way that the behavior of the actuators/sensors is anisotropic.

Through classical laminated plate theory, the principles of directional attachment can be examined. Assuming the actuator/sensor is isotropic or quasiisotropic, as most suitable actuator/sensor materials are, it is not possible to directly actuate or sense strains that arise from torsional deformations. For an isotropic material, the longitudinal modulus, $E_L$, the transverse modulus, $E_T$, and the Poisson's ratios, $\nu_{LT}$, $\nu_{TL}$, are equal. Utilizing the mathematical analysis given in "Mechanics of Composite Materials", Jones, R. M., published by Hemisphere Publishing Company, New York, N.Y., 1975, the reduced stiffnesses (in tensor notation) as given by equation 2.61 in Jones, 1975, are as follows:

$$E^*_{1111} = \frac{E_L}{1 - \nu_{LT}\nu_{TL}}, \quad E^*_{2222} = \frac{E_T}{1 - \nu_{LT}\nu_{TL}}, \quad (1)$$

$$E^*_{1122} = \frac{E_T\nu_{LT}}{1 - \nu_{LT}\nu_{TL}}, \quad E^*_{1212} = G_{TL}$$

$E^*_{1111}$ = reduced stiffness in longitudinal direction (GPA, MSI)

$E^*_{2222}$ = reduced stiffness in transverse direction (GPA, MSI)

$E^*_{1122}$ = reduced coupling stiffness (GPA, MSI)

$E^*_{1212}$ = shear modulus (GPA, MSI)

For isotropic actuator/sensor elements, from equations 1, $E^*_{1111} = E^*_{2222}$. If the actuator/sensor element is rotated to a particular angle with respect to the laminate or substrate, the rotated reduced stiffnesses are given by equations 2.80, Jones 1975, as follows:

$E_{1111} = E^*_{1111}\cos^4\theta + 2(E^*_{1122} + 2E^*_{1212})$
$\sin^2\theta\cos^2\theta + E^*_{2222}\sin^4\theta$ $E^*_{2222} = E^*_{1111}\sin^4\theta 2(E^*_{1122} + 2E^*_{1212})$
$\sin^2\theta\cos^2\theta + E^*_{2222}\cos^4\theta$ $E_{1122} = (E^*_{1111} + E^*_{2222} - 4E^*_{1212})$
$\sin^2\theta\cos^2\theta + E^*_{1122}(\sin^4\theta + \cos^4\theta)$ $E_{1212} = (E^*_{1111} + E^*_{2222} - E^*_{1122} - 2E^*_{1212})$
$\sin^2 + \cos^2\theta E^*_{1212}(\sin^4\theta + \cos^4\theta)$ $E_{1112} = (E^*_{1111} - E^*_{1122} - 2E^*_{1212})$ Sin
$\theta\cos^3\theta + (E^*_{1122} - E^*_{2222} + 2E^*_{1212})\sin^3\theta\cos\theta$ $E_{2212} = (E^*_{1111} - E^*_{1122} - 2E^*_{1212})\sin^3\theta\cos$
$\theta + (E^*_{1122} - E^*_{2222}2E^*_{1212})\sin\theta\cos^3\theta \quad (2)$ From equations 2, for an isotropic actuator/sensor element, it is seen that the rotated reduced stiffnesses are the same as the non-rotated stiffnesses and $E^*_{1112} = E^*_{2212} = 0$. Accordingly, the rotation angle has no effect on an actuator/sensor material that is completely integrated into or attached to a substrate. The strain energy in a beam demonstrates the relationship between the passive structure or substrate (laminate, lam.) and the actuator/sensor (a/s) as follows:

$$\frac{1}{2}\int_0^1 \left\{ [\epsilon_{11}^0 \; \epsilon_{22}^0 \; \epsilon_{12}^0 \; \kappa_{11} \; \kappa_{22} \; \kappa_{12}]_{lam} \left( \sum_{k=1}^{N} \begin{bmatrix} \begin{bmatrix} E_{1111} & E_{1122} & 2E_{1112} \\ E_{1122} & E_{2222} & 2E_{2212} \\ E_{1112} & E_{2212} & 2E_{1212} \end{bmatrix} \int_{z_{\kappa-1}}^{z_\kappa} dz \\ \begin{bmatrix} E_{1111} & E_{1122} & 2E_{1112} \\ E_{1122} & E_{2222} & 2E_{2212} \\ E_{1112} & E_{2212} & 2E_{1212} \end{bmatrix} \int_{z_{\kappa-1}}^{z_\kappa} z\,dz \end{bmatrix} \right.$$

$$\left. \begin{bmatrix} \begin{bmatrix} E_{1111} & E_{1122} & 2E_{1112} \\ E_{1122} & E_{2222} & 2E_{2212} \\ E_{1112} & E_{2212} & 2E_{1212} \end{bmatrix} \int_{z_{\kappa-1}}^{z_\kappa} z\,dz \\ \begin{bmatrix} E_{1111} & E_{1122} & 2E_{1112} \\ E_{1122} & E_{2222} & 2E_{2212} \\ E_{1112} & E_{2212} & 2E_{1212} \end{bmatrix} \int_{z_{\kappa-1}}^{z_\kappa} z^2\,dz \end{bmatrix} \right)_{lam} \begin{bmatrix} \epsilon_{11}^0 \\ \epsilon_{22}^0 \\ \epsilon_{12}^0 \\ \kappa_{11} \\ \kappa_{22} \\ \kappa_{12} \end{bmatrix}_{lam} + [\epsilon_{11}^0 \; \epsilon_{22}^0 \; \epsilon_{12}^0 \; \kappa_{11} \; \kappa_{22} \; \kappa_{12}]_{a/s} \tag{3}$$

$$\left[ \sum_{k=1}^{N} \begin{bmatrix} \begin{bmatrix} E_{1111} & E_{1122} & 0 \\ E_{1122} & E_{1111} & 0 \\ 0 & 0 & 2E_{1212} \end{bmatrix} \int_{z_{\kappa-1}}^{z_\kappa} dz & \begin{bmatrix} E_{111} & E_{1122} & 0 \\ E_{1122} & E_{1111} & 0 \\ 0 & 0 & 2E_{1212} \end{bmatrix} \int_{z_{\kappa-1}}^{z_\kappa} z\,dz \\ \begin{bmatrix} E_{1111} & E_{1122} & 0 \\ E_{1122} & E_{1111} & 0 \\ 0 & 0 & 2E_{1212} \end{bmatrix} \int_{z_{\kappa-1}}^{z_\kappa} z\,dz & \begin{bmatrix} E_{1111} & E_{1122} & 0 \\ E_{1122} & E_{1111} & 0 \\ 0 & 0 & 2E_{1212} \end{bmatrix} \int_{z_{\kappa-1}}^{z_\kappa} z^2\,dz \end{bmatrix}_{a/s} \begin{bmatrix} \epsilon_{11}^0 \\ \epsilon_{22}^0 \\ \epsilon_{12}^0 \\ \kappa_{11} \\ \kappa_{22} \\ \kappa_{12} \end{bmatrix}_{lam} \right\} dl$$

$\epsilon^\circ_{11}$ = longitudinal extension strain (M/M, IN/IN)
$\epsilon^\circ_{22}$ = transverse extension strain (M/M, IN/IN)
$\epsilon^\circ_{12}$ = shear strain (M/M, IN/IN)
$\kappa^\circ_{11}$ = longitudinal bending (RAD/M)
$\kappa^\circ_{22}$ = transverse bending (RAD/M)
$\kappa^\circ_{12}$ = twist (RAD/M)

N = number of plys, k = individual ply, z = distance through the thickness, as given in Jones, 1975.

For piezoelectric crystals, the strain actuation matrix is composed of actuation voltages, $E_x$, and charge coefficients, $d_{xx}$, and according to equation 29 from a paper titled "Development of Piezoelectric Technology for Applications in Control of Intelligent Structures" by Crawley, E. F. et al. presented at the American Control Conference, June 1988, are related to the actuation strain matrix by, $$[\epsilon_{11}^0 \; \epsilon_{22}^0 \; \epsilon_{12}^0 \; \kappa_{11} \; \kappa_{22} \; \kappa_{12}]_a = \tag{4}$$

$$[E_1 E_2 E_3] \begin{bmatrix} 0 & 0 & 0 & 0 & d_{15} & 0 \\ 0 & 0 & 0 & d_{15} & 0 & 0 \\ d_{31} & d_{31} & d_{33} & 0 & 0 & 0 \end{bmatrix}$$

$E_1$ = charge across crystal in longitudinal direction (V)
$E_2$ = charge across crystal in transverse direction (V)
$E_3$ = charge across crystal in thickness direction (V)
$d_{31}$ = transverse charge coefficient ($\mu$ strain/$_{(V/mm)}$)
$d_{33}$ = direct charge coefficient ($\mu$ strain/$_{(V/mm)}$)
$d_{15}$ = shear coupling charge ($\mu$ strain/$_{(V/mm)}$)

Similarly, for a piezoelectric sensor, the strain sensing matrix is composed of sensing voltages, $V_x$, and voltage coefficients, $g_{xx}$.

$$[\epsilon_{11}^0 \; \epsilon_{22}^0 \; \epsilon_{12}^0 \; \kappa_{11} \; \kappa_{22} \; \kappa_{12}]_s = \tag{5}$$

$$[V_1 V_2 V_3] \begin{bmatrix} 0 & 0 & 0 & 0 & g_{15} & 0 \\ 0 & 0 & 0 & g_{15} & 0 & 0 \\ g_{31} & g_{31} & g_{33} & 0 & 0 & 0 \end{bmatrix}$$

$V_1$ = potential across crystal in longitudinal direction
$V_2$ = potential across crystal in transverse direction
$V_3$ = potential across crystal in thickness direction
$g_{31}$ = transverse voltage coefficient
$g_{33}$ = direct voltage coefficient
$g_{15}$ = shear coupling voltage For practical purposes, the only voltages that can be actuated or sensed are through the thickness of the actuator/sensor element ($E_3 d_{31}$, $V_3 g_{31}$) because of the lead attachment area, equations 6 and 7 follow:

$$[\epsilon^0{}_{11} \epsilon^0{}_{22} \epsilon^0{}_{12} \; \kappa_{11} \; \kappa_{22} \; \kappa_{12}]_s = [E_3 d_{31} E_3 d_{31} \; 0 \; 0 \; 0 \; 0] \tag{6}$$

$$[\epsilon^0{}_{11} \epsilon^0{}_{22} \epsilon^0{}_{12} \; \kappa_{11} \; \kappa_{22} \; \kappa_{12}]_s = [V_3 g_{31} V_3 g_{31} 0 \; 0 \; 0 \; 0] \tag{7}$$

From equations 1 through 7, the only types of actuation/sensing that current (isotropic) types of fully attached actuator/sensor elements can actuate/sense are longitudinal extension, $\epsilon^0{}_{11}$, lateral extension, $\epsilon^0{}_{22}$ longitudinal bending, $\kappa_{11}$, and lateral bending $\kappa_{22}$. For the fully attached, isotropic actuator/sensor, $\epsilon^0{}_{11}$ cannot be distinguished from $\epsilon^0{}_{22}$, and $\kappa_{11}$ cannot be distinguished from The shear strain, $\epsilon^0{}_{12}$ and the twist, $\kappa_{12}$, cannot be actuated or sensed at all.

SUMMARY OF THE INVENTION

Accordingly, one object of the present invention is to provide a novel system of directionally attaching of an actuator/sensor to a structure in which it is possible to sense a strain in the structure or actuate the structure in a desired direction, regardless of the passive stiffness properties of the structure, actuator element, or sensor element.

Another object of the present invention is to attach an actuator/sensor to a structure such that torsional and bending deflections can be actuated/sensed.

Yet a further object of the present invention is to attach an actuator/sensor to a structure such that the actuator/sensor behaves in an anisotropic way.

These and other objects are achieved according to the present invention by providing a new and improved apparatus, system and method for actuating or sensing strains in a substrate, including at least one actuator/sensor element having transverse and longitudinal axes, wherein the actuator/sensor element is attached to the substrate in such a manner that the stiffness of the actuator/sensor element differs in the transverse and longitudinal axes of the actuator/sensor element.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2(a–h) represents alternative techniques of a directionally attached actuator/sensor;

FIG. 2I illustrates three symbols used in FIGS. 2A–2H respectively representing, from left to right, flexible attachment, rigid attachment and shear attachment.

FIG. 10 shows a torque plate wing formed with active elements;

FIG. 11a shows the torque plate wing of FIG. 10 with a voltage of a first polarity applied thereto;

FIG. 11b shows the torque plate wing of FIG. 10 with a voltage of a second polarity applied thereto;

DESCRIPTION OF THE PREFERRED EMBODIMENTS

Figure 1A:
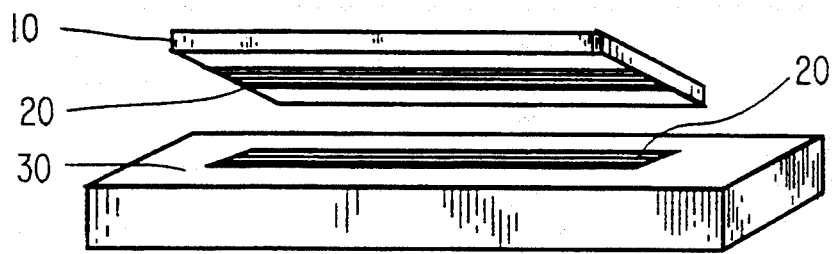
FIG. 1a and 1b represents first and second embodiment of a directionally attached actuator/sensor and substrate.

Referring now to the drawings wherein like reference numerals designate identical or corresponding parts throughout the several views and more particularly to FIG. 1(a) thereof, in which a first embodiment of a directionally attached piezoelectric actuator/sensor of the present invention is shown.

The present invention can operate utilizing piezoelectric, magnetostrictive, shape memory alloy (SMA) and thermally actuated lamina (including bimetallic) actuator/sensor elements, and in a preferred embodiment utilizes piezoelectric actuator/sensor elements.

The present invention can operate in a preferred embodiment utilizing conventional stamped and extruded piezoelectric elements. Conventional stamped piezoelectric elements, however, have been found to be about 1.5 times more effective than extruded piezoelectric elements. Furthermore, the present invention is operable on any substrates which actuator/sensor elements are conventionally coupled to such as aluminum, graphite/epoxy composites, etc. Furthermore, conventional circuitry can be used to generate and apply to the actuator element actuation signals, or to sense signals produced by the element in the detection of strains occurring in a substrate.

The present invention utilizes a system of directional attachment of an actuator or sensor element onto a substrate such that strains can be sensed or generated in a desired direction, independent of the passive stiffness and geometric properties of the substrate, actuator or sensor material. In this way, an isotropic actuator/sensor element is attached to a substrate in such a way that its behavior is anisotropic. To achieve these results the present invention utilizes a partial attachment system as shown in FIG. 1(a), in which a portion of the actuator/sensor is made inactive in one strain (i.e., the transverse strain) and is made active in the other strain (i.e., the longitudinal strain). As shown in FIG. 1, an actuator/sensor 10 is attached to a substrate 30 only in the area defined as the area of attachment 20. This area of attachment can take on an area in the range of approximately the central 1/5 to 3/4 of the actuator/sensor element. In a preferred embodiment, the area of attachment will occupy approximately the central 1/3 (third) of the width of the actuator/sensor and substrate and run the entire length of the actuator/sensor.

Figure 1B:
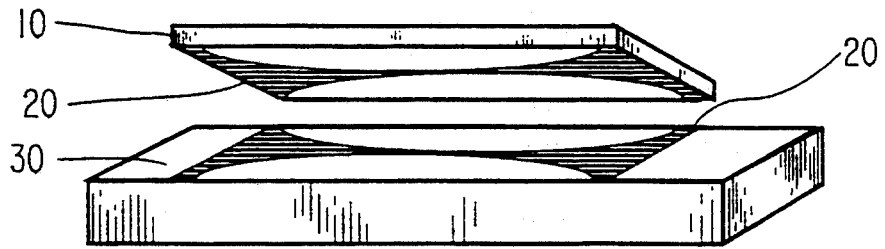

FIG. 1(b) represents an inverse ellipse partial attachment pattern which the area of attachment between the actuator/sensor and substrate can take on to achieve the same results as that of FIG. 1(a).

The actuator/sensor elements can be attached to the substrate using conventional surface bonding techniques utilizing a bonding agent such as M-Bond 200 TM manufactured by The Loctite Co. (through M-Line Products) or a conventional epoxy. Another way to attach the actuator/sensor elements is by embedding the actuator/sensor elements into the substrate.

FIGS. 2(a-h) detail other possible partial attachment systems. FIG. 2(a) shows the inverse elipse pattern described in FIG. 1(b) above and FIG. 2(b) shows the central third attachment pattern described in FIG. 1(a) above. As shown in FIG. 2(c) the bonding agent may also be only applied to the piezoelectric element at its edge portions in its traverse axes. As shown in FIG. 2(d) the actuator/sensor element need only be rigidly attached at its transverse axes edges. As shown in FIG. 2(e-h), the actuator/sensor element can be embedded in the substrate utilizing any of the above cited patterns so long as the edges in the transverse axes are rigidly attached and the edges in the longitudinal axes are flexibly attached.

The flexible attachment areas and rigid attachment areas can be effectuated by the manner in which the actuator/sensor element is either placed on the surface of the substrate on embedded into the substrate. That is, with reference to FIGS. 2(e-h), the actuator/sensor elements will be embedded into a slot in the substrate. The size of the slot in the substrate can be manipulated to provide the flexible and rigid attachment areas. That is, if the size of the slot in the substrate is chosen such that the actuator/sensor element fits snugly in the slot in the longitudinal direction and loosely in the slot in the transverse directions, then the rigid (snug) and flexible (loose) attachments as shown in FIGS. 2(e-h) will be effectuated. The slot in which the actuator/sensor element is embedded then must be slightly larger than the actuator/sensor element in the transverse direction, allowing enough extra space for the actuator/sensor element to expand and just large enough in the longitudinal direction to allow the actuator/sensor element to fit into the slot. Thus, by the actuator/sensor element fitting snugly in the substrate in the longitudinal direction and loosely in the substrate in the transverse direction, a rigid attachment in the longitudinal direction and a flexible attachment in the transverse direction will be effectuated. As to FIG. 2(d), the manner in which the actuator/sensor element is placed on the surface of the substrate can also effectuate a rigid attachment at its transverse axis edges. This can be accomplished, for example, by placing the actuator/sensor element between two rigid members which extend above the surface of the substrate, or in any other conventional manner.

The embodiments shown in FIGS. 1 and 2 operate such that when the actuator/sensor element becomes active, stress is rapidly distributed to the free edges in the longitudinal strain. In this way, the embodiments of FIGS. 1 and 2 operate such that the unattached sides of the actuator/sensor element contribute to the longitudinal stiffness of the element and therefore make the actuator/sensor element impart more longitudinal than transverse stiffness to the substrate. In this way, the end effect is that the stiffness of the actuator/sensor as seen from the substrate is greater in the longitudinal direction than it is in the transverse direction.

Figure 3:
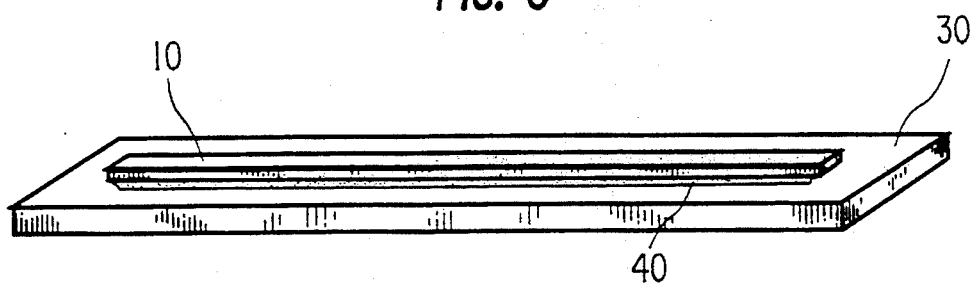
FIG. 3 represents a third embodiment of a directionally attached actuator/sensor.
Figure 4:
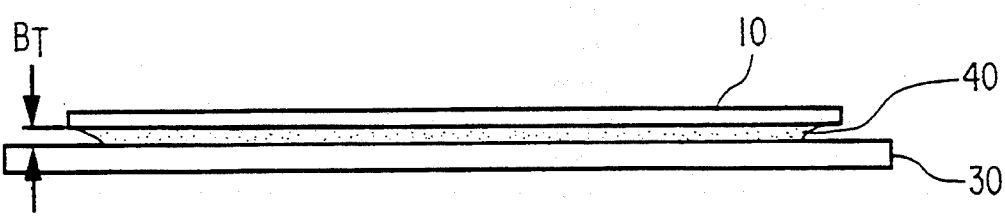
FIG. 4 represents a side view of the embodiment of FIG. 3.
Figure 5:
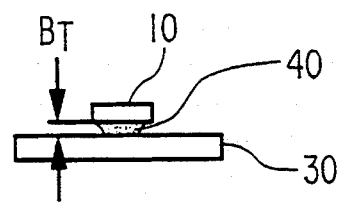
FIG. 5 represents an end view of the embodiment of FIG. 3.

FIGS. 3-5 show a second system of attaching an actuator/sensor to a substrate in such a way that the same results as described with reference to FIGS. 1 and 2 are achieved. The system of FIGS. 3-5 achieves these results by increasing the aspect ratio and bond line thickness of the actuator/sensor element to the point where the finite amount of shear lag present in the bond line significantly reduces the transverse stiffness of the element. The aspect ratio is defined as $L_{a/s}/W_{a/s}$, and the bond line thickness is shown as $B_T$ in FIGS. 3-5. The aspect ratio should take on values greater than 10:1 and the bond line thickness should be approximately the same as the actuator/sensor element thickness. The greater the aspect ratio the more improved the performance and the aspect ratio should ideally be infinite. Also, the bond line thickness will need to be optimized in each individual application but generally will be approximately the same thickness as the actuator/sensor element. FIGS. 3-5 detail exaggerated deflections of the bonding material to illustrate the finite shear lag in longitudinal and transverse directions. The effective length of the actuator/sensor Le reflects the effective length of the actuator that actually produces strain in the substrate or the length of the sensor that actually has strain produced in it by the substrate. In the system of FIGS. 3-5 the ratio of the effective length of the actuator/sensor Le divided by the actual length La/s should be approximately equal to one. Furthermore, in this preferred embodiment Le/La should be a factor of 2 or more greater than the width effectiveness ratio, We/Wa. By tailoring the thickness of the bond line and attachment area, the transverse shear lag can produce the beneficial effect of further reducing the effective width of the actuator/sensor while maintaining a high effective length.

One further approach to achieving the results of the directional attachment of the present invention is to utilize a system which combines the partial attachment technique of FIGS. 1 and 2 with the transverse shear lag techniques of FIGS. 3-5.

Since directional attachment effectively reduces the stiffnesses of the actuator/sensor, $E_{Ta/s} \neq E_{La/s}$. From equations 1 the reduced stillnesses, $E^*_{1111a/s} \neq E^*_{2222a/s}$ and from equations 2, the rotated reduced stiffnesses are not equal to the non-rotated values with $E_{1112a/s} \neq 0$, $E_{2212a/s} \neq 0$. The resulting actuation/sensing stiffness matrix is fully populated. With the implementation of directional attachment, equation 3 takes the form of equation 8.

$$\frac{1}{2}\int_0^1 \Biggl\{ [\epsilon_{11}^0\ \epsilon_{22}^0\ \epsilon_{12}^0\ \kappa_{11}\ \kappa_{22}\ \kappa_{12}]^{lam} \Biggl[ \sum_{k=1}^{N} \Biggl[ \begin{array}{c} \begin{bmatrix} E_{1111} & E_{1122} & 2E_{1112} \\ E_{1122} & E_{2222} & 2E_{2212} \\ E_{1112} & E_{2212} & 2E_{1212} \end{bmatrix} \int_{z_{k-1}}^{z_k} dz \\ \begin{bmatrix} E_{1111} & E_{1122} & 2E_{1112} \\ E_{1122} & E_{2222} & 2E_{2212} \\ E_{1112} & E_{2212} & 2E_{1212} \end{bmatrix} \int_{z_{k-1}}^{z_k} zdz \end{array}$$

$$\begin{array}{c} \begin{bmatrix} E_{1111} & E_{1122} & 2E_{1112} \\ E_{1122} & E_{2222} & 2E_{2212} \\ E_{1112} & E_{2212} & 2E_{1212} \end{bmatrix} \int_{z_{k-1}}^{z_k} zdz \\ \begin{bmatrix} E_{1111} & E_{1122} & 2E_{1112} \\ E_{1122} & E_{2222} & 2E_{2212} \\ E_{1112} & E_{2212} & 2E_{1212} \end{bmatrix} \int_{z_{k-1}}^{z_k} z^2 dz \end{array} \Biggr] \Biggr] \begin{bmatrix} \epsilon_{11}^0 \\ \epsilon_{22}^0 \\ \epsilon_{12}^0 \\ \kappa_{11} \\ \kappa_{22} \\ \kappa_{12} \end{bmatrix}_{lam} + [\epsilon_{11}^0\ \epsilon_{22}^0\ \epsilon_{12}^0\ \kappa_{11}\ \kappa_{22}\ \kappa_{12}]_{a/s}$$

$$\Biggl[ \sum_{k=1}^{N} \Biggl( \begin{bmatrix} \begin{bmatrix} E_{1111} & E_{1122} & 2E_{1112} \\ E_{1122} & E_{2222} & 2E_{2212} \\ E_{1112} & E_{2212} & 2E_{1212} \end{bmatrix}\int_{z_{k-1}}^{z_k} dz & \begin{bmatrix} E_{1111} & E_{1122} & 2E_{1112} \\ E_{1122} & E_{2222} & 2E_{2212} \\ E_{1112} & E_{2212} & 2E_{1212} \end{bmatrix}\int_{z_{k-1}}^{z_k} zdz \\ \begin{bmatrix} E_{1111} & E_{1122} & 2E_{1112} \\ E_{1122} & E_{2222} & 2E_{2212} \\ E_{1112} & E_{2212} & 2E_{1212} \end{bmatrix}\int_{z_{k-1}}^{z_k} zdz & \begin{bmatrix} E_{1111} & E_{1122} & 2E_{1112} \\ E_{1122} & E_{2222} & 2E_{2212} \\ E_{1112} & E_{2212} & 2E_{1212} \end{bmatrix}\int_{z_{k-1}}^{z_k} z^2 dz \end{bmatrix}_{a/s} \Biggr) \begin{bmatrix} \epsilon_{11}^0 \\ \epsilon_{22}^0 \\ \epsilon_{12}^0 \\ \kappa_{11} \\ \kappa_{22} \\ \kappa_{12} \end{bmatrix}_{lam} \Biggr\} dl \qquad (8)$$

Figure 6:
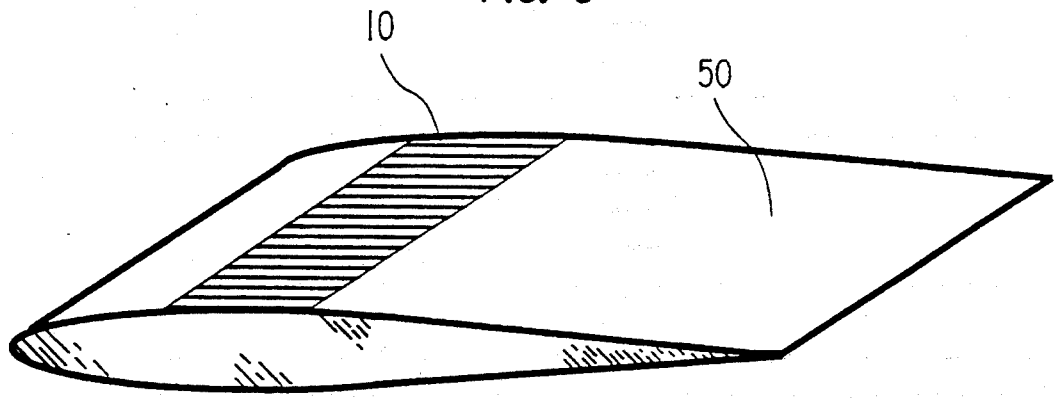
FIG. 6 represents an aeronautical element utilizing particular actuator/sensors of piezoelectric crystals which are directionally attached.
Figure 7:
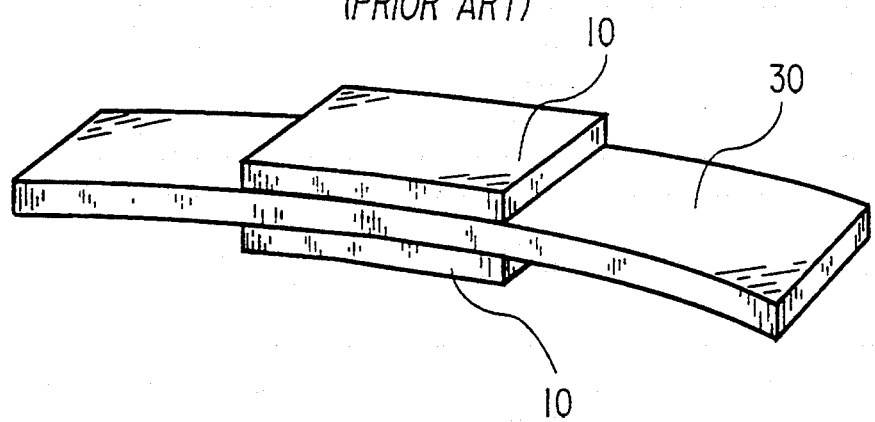
FIG. 7 represents a bending-twist coupled actuator/sensor element and substrate.
Figure 8:
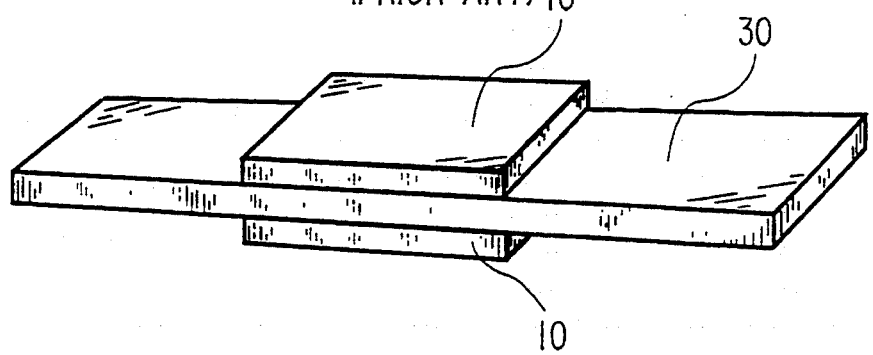
FIG. 8 represents an extension-twist coupled actuator/sensor element and substrate.

Equation 8 shows that through directional attachment, any mode of strain can be forced/detected if the actuator/sensor is sensitive to just one or two extensional strains: $\epsilon_{11}^0$ and/or $\epsilon_{22}^0$. Most types of sensor/actuator materials are isotropic and sensitive in just this way. And as demonstrated by equations 4 through 7, actuator/sensor elements are particularly well suited for directional attachment. FIG. 6 shows one implementation of directionally attaching actuator/sensor elements onto an aeronautical member such as an airfoil or rotor blade.

In a preferred embodiment, those actuator/sensor elements are piezoelectric elements, but may also be magnetostrictive, shape memory alloys or thermally actuated lamina (including bi-metallix) elements. As shown in FIG. 6 a plurality of piezoelectric elements 10, as represented by the dark lines, are attached to an aeronautical member 50 at an angle, which may be, for example, 45°. The piezoelectric elements 10 are attached in one of the above-described techniques, that is, utilizing either of the partial attachment systems detailed in FIGS. 1 or 2, the system detailed in FIGS. 3-5 or a combination of the above two systems. Utilizing one of the above-described directional attachment techniques the piezoelectric elements 10 will behave in an anisotropic way and thus are able to impart a torsional deflection or sensing to the aeronautical element. This torsional deflection or sensing can then be implemented for such reasons as vibration reducing, in-flight tracking blade and dynamic stall reduction. Attaching the piezoelectric elements 10 at a 45° to the aeronautical member 50 allows the piezoelectric elements 10 to maximize the torsional deflection imparted or sensed to or from the aeronautical member 50. However, the angle of the piezoelectric elements can take on any value dependent on the amount of torsional deflection to be actuated or sensed. It is noted that the spacing of the piezoelectrical elements in this configuration is important. If the spacing is too large, then the effective density is reduced. If the spacing is too small, then capillary action may draw the bonding agent between the piezoelectric elements. If the bonding agent accumulates between the crystals, then the directionality is destroyed as the behavior of the piezoelectric elements becomes quasi-isotropic; and accordingly, twist and torsional deflection cannot be actuated or sensed. In this prefered embodiment, the proper spacing is approximately 10 mil. (1 mil.=0.001") and should at least exceed 5 mil. to avoid drawing the bonding agent between the piezoelectric elements through capillary action.

As noted, the directional attachment techniques of the present invention may have many applications such as actuation and sensing of rotor blade and aircraft wing twist and bending distribution, actuation and sensing of space-based structures including space-trusses, targeting/sensing apparatus and weapons platforms, torque actuation and sensing, including simultaneously actuating and sensing high frequency variations in torque and bending loads, and use in Multi-mode accelerometers.

As previously noted, the utilization of the directionally attached actuator/sensor elements can be accomplished in several ways, each being slightly different than the others as the different types of actuator/sensor materials behave differently.

For directionally attached pizoelectric elements, a voltage is applied across the surfaces of the elements. Specifically, for piezoelectric crystals, voltage potentials ranging from 100 to 20,000 V/mm of crystal thickness are used for actuation, depending on the specific type of crystal. The voltage signal can be steady-state, time-variant, or impulse. Each of the types of actuations will produce specific deflections as prescribed by the manufacturers. If the directionally attached piezoelectric crystals are used for sensing, an impulsive, steady-state or time-variant structural strain will produce voltages across the crystal faces according to the manufacturers data. These sensed voltages or actuated strains can be used alone (for structural actuation only or structural sensing only) or simultaneously in a feedback loop arrangement. For the piezoelectric sensor/actuator element, actuation and sensing can be accomplished at the same time through the measurement of the voltage and impedance of the crystal. The aeronautical member or rotor blade shown in FIG. 6 can utilize the feedback loop arrangement shown in FIG. 9.

Figure 9:
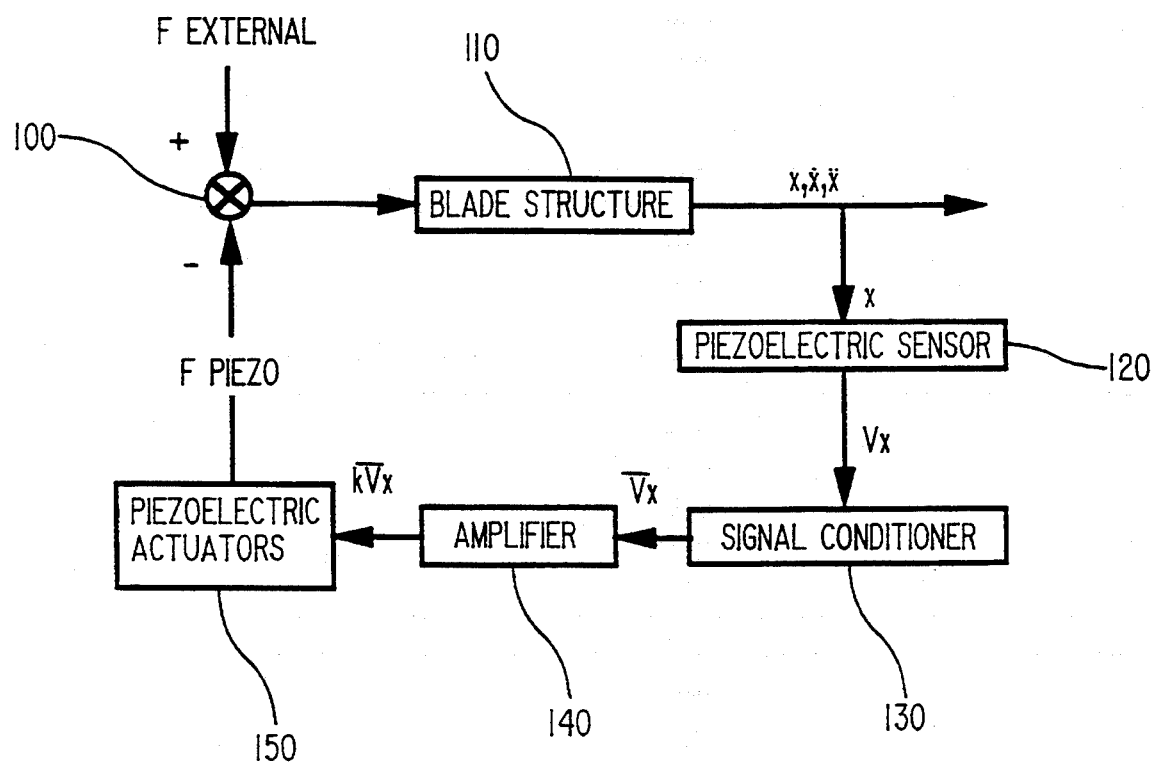
FIG. 9 represents a feedback control system for use with a directionally attached actuator/sensor system.

As shown in FIG. 9, two signals, a first signal Fexternal which represents the external forces acting on the aeronautical member, and a second signal Fpiezo which represents the force applied to the aeronautical member by the piezoelectric elements, act on the aeronautical memeber as represented by the adder 100. Thus these forces both act on the aeronautical member simultaneously to be thus combined. The difference between these two signals Fexternal and Fpiezo is a signal represented as Fnet in FIG. 9 which is then input into the feedback loop. This signal Fnet represents a signal to be cancelled by the feedback loop. That is, this signal Fnet is to be cancelled to eliminate any displacement in the aeronautical member 50. The particular transfer function of the aeronautical member will vary from one aeronautical member to the other and is represented in FIG. 9 as box 110, Blade Structure. The signal Fnet then, which will be a function of the specific blade structure of the aeronautical member as represented by box 110, can be represented by a function of three signals, displacement X, velocity X', and acceleration X'', as shown in FIG. 9. In the present case, it is the displacement X of the aeronautical member which is to be cancelled. Thus, the piezoelectric sensor 120 will sense the displacement in the aeronautical member and output it as a voltage signal represented as $V_x$ in FIG. 9. This signal $V_x$ then will be fed into a signal conditioner 130. The specifics of the signal conditioner 130 will vary from application to application and any conventional signal conditioner which acts in such piezoelectric circuits may be employed, such as a PCB Brand Model 482A04. The signal output from the signal conditioner 130 will then be fed into an amplifier 140 which multiplies the signal by k. The output from this amplifier 140 will then be applied to the piezoelectric actuators 150. A certain force will then be imparted onto the piezoelectric actuators as represented by Fpiezo in FIG. 9. In this way, Fpiezo will approach Fexternal and consequently Fnet will be minimized.

For directionally attached magnetostrictive actuator/sensor elements, the actuation and sensing characteristics are similar to those of the piezoelectric, but accomplished through the use of a magnetic field. The magnetic field is generated (most frequently) through the use of electrical current passing through wires nearby or surrounding the magnetostrictive element. The magnetic field causes the element to expand which induces structural strains. For sensing, structural strains induce the magnetostrictive element to create a magnetic field which is sensed by electrical wires adjacent to the element. The control loop arrangement is similar to that shown in FIG. 9 can be employed utilizing magnetostrictive elements, but with an intermediate magnetic field. Again, the magnetostrictive elements can be used for sensing alone, actuation alone, or actuation and sensing at the same time.

For the actuation of the directionally attached shape-memory-alloys, strains can be induced by the use of a thermal, electrical, or electro-thermal triggers. No sensing is currently feasible with the use of shape-memory alloys.

For the actuation of directionally attached bimetallic or, more generally, thermally actuated lamina, thermal changes or gradients must be applied to the laminate to produce strains. Two or more materials that have different coefficients of thermal expansions can be directionally attached so as to impart orthotropic actuation loads. Sensing cannot currently be accomplished by the use of thermally actuated lamina. Metal structures are particularly amendable to this form of directional attachment.

One particular application of the present invention may be in aerodynamic or hydrodynamic type systems, whereby directionally attached elements can be applied to wings or fins. In particular, the directionally attached elements of the present invention may be applied as a torque plate wing used on an aircraft, as one example.

A torque plate wing according to the present invention is composed of components arranged in and around an airfoil skin which can be pitched to different angles according to how much voltage is applied to the actuator elements employed therein, as shown in FIG. 10.

From FIG. 10, it is seen that at the core of a wing section is a substrate plate 160. This substrate plate 160 can be composed of metals such as aluminum, brass or steel, plastics like Mylar TM, Kevlar TM, ceramics or composites like fiberglass and epoxy. An optimum substrate for maximum torsional deflection is a stiff, thin substrate like beryllium. Attached to the substrate plate 160 are actuator elements 170. These actuator elements 170 can beneficially be directionally attached actuator elements, such as the same as the directionally attached actuator elements 10 shown in FIGS. 1–5, e.g. they may be piezoelectric elements. That is, these actuator elements 170 may be elements which employ the bonding techniques discussed above with respect to FIGS. 1–5, and the ensuing discussion will treat actuator elements 170 as directionally attached actuator elements, although other types of actuator elements can be used. Further, these directionally attached elements 170 are directionally attached at an angle neither parallel to, nor perpendicular to, the longitudinal axis of the wing or substrate plate 160. The off-axis placement of the directionally attached elements 170 allows them to impart torsional loads on the substrate plate 160 and to accordingly twist the substrate plate 160. The directionally attached elements 170 may be placed on both faces of the substrate plate 160, as described in more detail below.

Placed perpendicular to the directionally attached actuator elements 170 is a main spar 180. This main spar 180 carries the bending loads that the torque plate wing will encounter. This main spar 180 may be made of metal, plastic, ceramic or composite, or any other material so long as it is suited to carrying the proper loads to which the wing is designed to be subjected. Main spar 180 may be shaped like a plate (as shown), or have a "T" section, "I" section, "C" section or "Z" section, as commonly used in engineering applications, or any other section that is suitably designed for carrying the bending and shear loads that the torque plate wing will encounter. The main spar 180 also fixes the wing elastic axis in pitch. Accordingly, for subsonic flight the main spar 180 may be placed at the quarter-chord of the airfoil for neutral aeroelastic coupling, ahead of the quarter-chord for stabilizing aeroelastic coupling or behind the quarter-chord if aeroservoelastic properties are to be obtained from this wing. For supersonic applications, the half-chord is used instead of the quarter-chord. The chord of the wing is defined as the dimension of the wing from its leading edge to its trailing edge, e.g., as shown in FIG. 10 from the left edge to the right edge of the wing. The quarter chord is then a point on this chord dimension one quarter of the length away from the leading edge towards the trailing edge. As shown in FIG. 10, the main spar 180 is just behind the quarter chord, i.e. past the quarter-chord toward the trailing edge.

The main spar 180 and the substrate plate 160 are rigidly attached to a base fixture 190 at their root areas. This base fixture 190 can be made from any suitable material for carrying the bending, tension and shear loads to which it will be subjected. This base fixture 190 may or may not be shaped like an airfoil. The base fixture 190 will be used to attach the airfoil to mounts on sides of any vehicle or device which uses the torque plate wing. Flanges (not shown) of the main spar 180 may wrap completely around the base fixture 190 if "T", "I" "C" or "Z" sections are used for the main spar 180. If such sections are used, then the flanges will also be rigidly anchored to the base fixture either at the sides, top, or bottom with mechanical fasteners, welds, co-curing or adhesive bonding.

From the tops and the bottoms of the directionally attached actuator elements 170, electrical leads 200 will be attached, either by soldering, welding, vapor deposition or any other suitable method of forming an electrical connection. These electrical leads 200 will be collected and taken out the aft of the wing as seen in FIG. 10. These electrical leads 200 may be conventional metallic wire, carbon piles, superconducting materials, conducting epoxies, or conducting polymers.

Surrounding the torque plate assembly is an aerodynamic shell or wing skin 210. This wing skin 210 may be fully monocoque or semimonocoque in structure and is of some finite thickness. The wing skin 210 may be constructed from any suitable metal, plastic or composite material.

At the end of the wing skin 210 is an end plate 220. This end plate 220 is rigidly attached to the substrate plate 160 and joins the wing skin 210 to the substrate plate 160. This end plate 220 may be composed of two or more pieces to allow for disassembly and inspection, or it may be composed of one single bonded or welded piece that joins the wing skin 210 and the substrate plate 160.

Also, as seen in FIGS. 15a and 15b, connected to the end plate 220 is the main spar 180. The main spar 180 helps transmit some of the bending load that the wing skin 210 encounters to the internal structure, including the actuator elements 170 and the substrate plate 160. For certain applications, there may be no end plate 220 and the wing skin 210 may become more flat until it joins the substrate plate 160 at the wing tip where the two are rigidly joined.

It should be noted that the shape of the substrate plate 160 and the corresponding shape of the actuator elements 170 may be tailored to allow greater rotation of the aerodynamic shell or wing skin 210 if required. This is accomplished by making the root section of the substrate plate 160 and the corresponding actuator elements 170 more narrow at their root juncture where they are attached to base fixture 190. This geometric tailoring may also be accompanied by a thickening of the substrate plate 160 to maintain a constant torsional stiffness. Accordingly, the shape of the torque plate, which hereafter refers to the combination of the substrate plate 160 and actuator elements 170, may be trapezoidal with the more narrow portion at the root and the wide portion at the tip, where the end plate 220 is joined.

Positioning of the wing skin 210 with respect to the main spar 180 may lend aeroservoelastic properties to the wing structure. That is, if the wing flies subsonically, and the main spar 180 is ahead of the quarter-chord of the wing skin 210 180, i.e., in front of the quarter-chord toward the leading edge of the wing, then deflections of the substrate plate 160 will tend to decrease with increasing airspeed. If the quarter-chord is at the same location as the main spar 180, then there will be neither an increase nor a decrease in pitch deflection with increasing airspeed and an uncambered airfoil. If, however, the main spar 180 is behind the quarter-chord of the wing skin 210, then twist deflections of the substrate plate 160, and accordingly pitch deflections of the wing skin 210, will increase with increasing airspeed.

This aeroservoelasticity can be used to magnify the control power available from the directionally attached actuator elements 170. As a result, a small pitch deflection may be commanded by the actuator elements 170. This small pitch deflection will then grow to a large pitch deflection through air loads with positive aeroservoelasticity. This subsonic aeroservoelasticity has a supersonic counterpart in that instead of referencing the main spar 180 position with respect to the quarter-chord of the wing skin 210, the positions are referenced with respect to the half-chord of the aerodynamic shell. Supersonically, the aerodynamic center moves from the quarter-chord to the half-chord (at a Mach number of 1). This will tend to stabilize the deflections of a subsonically designed airfoil and will help to retard divergence.

When the actuator elements 170 are energized, the substrate plate 160 will be twisted in one direction, to thereby twist wing skin 210, as shown in FIG. 11a. The deflection will correspond to a particular charge arrangement, i.e., a particular voltage polarity, on the leads 200 of the actuator elements. If the charge on the leads 200 is reversed, then the direction of the twist is also reversed, as shown in FIG. 11b. The direction and magnitude of twist will be a function of the actuator material type and voltage applied. For piezoelectric elements used as the actuator elements 170, motion in both twist directions as shown in FIGS. 11a and 11b is possible. However, electrostrictive or magnetostrictive elements will have to be differentially actuated to produce twist in either direction. That is, if actuator elements 170 are formed of electrostrictive or magnetostricture elements, actuator elements 170 on one side of the substrate plate 160 are energized for twist in a given direction. To produce twist in the opposite direction, the first set of elements are turned off, i.e. have no voltage applied thereto, and the actuator elements 170 on the other side of the substrate plate 160 are energized.

Figure 12:
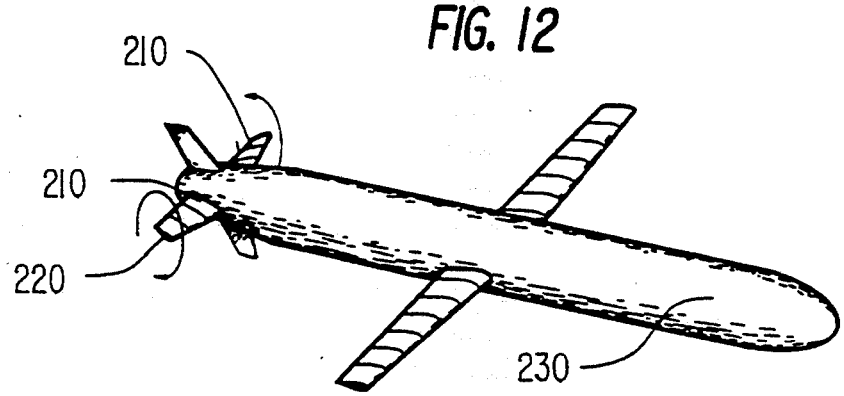
FIG. 12 shows a first aircraft which has a torque plate wing employed therein.

These torque plate wings may be found on aircraft such as a missile 230, as shown in FIG. 12. As shown in FIG. 12, the horizontal and vertical stabilizers may be formed of the torque plate wings described above. In FIG. 12, the wing skin 210 and end plate 220 of the horizontal and vertical stabilizers are deflected in pitch to control the missile. These deflections may be used for roll control, pitch control or directional control. The vertical stabilizers may also be of this design, which would allow for crossed control coupling, and full 3-axis flight control. The various types of rockets, munitions and missiles that such a torque plate wing may be used on include, but are clearly not limited to, cruise missiles, surface-to-air missiles, air-to-air missiles, air-to-ground missiles, anti-shipping missiles, space destined missiles or surface-to-surface missiles. Manned aircraft may also use such torque plate wings. These aircraft include all types of fixed and rotary wing aircraft including helicopters, attack, fighter, transport, utility, acrobatic, commercial transport, commuter and general aviation aircraft.

Figure 13:
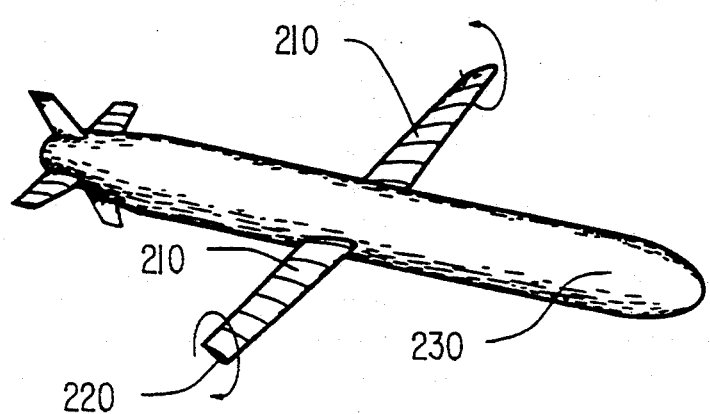
FIG. 13 shows a second aircraft which has a torque plate wing employed therein.

Another use for such torque plate wings are on the main wings of an aircraft 230, as shown in FIG. 13. In this case, the main wings are allowed to deflect to control the lift of the aircraft 230 and roll.

Figure 14:
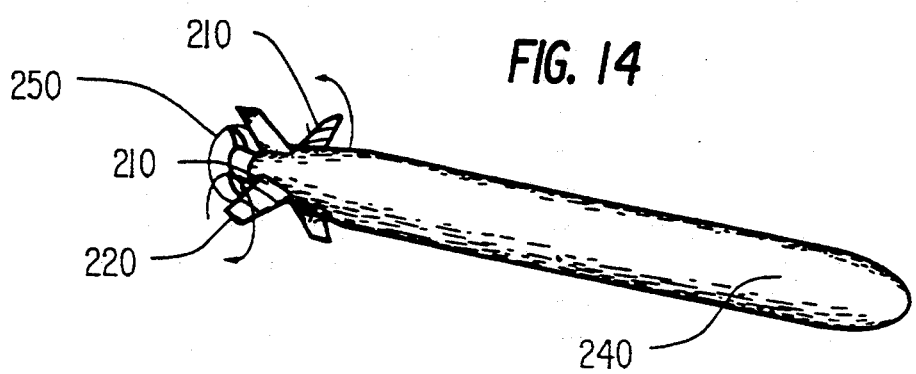
FIG. 14 shows a torpedo type craft which has a torque plate fin employed therein.

Another application of the torque plate wings are as fins on torpedoes 240 and other types of marine vessels, as shown in FIG. 14. The stabilizers of surface ships, submarines and torpedoes may be made from such torque plate wings so that they can be controlled in pitch, roll and yaw. As with aircraft, the marine vessels will use these fins for controlling the path of the vehicle and maintaining its attitude. To accomplish this more quietly and efficiently, the propeller of the marine vessel 250 may also use a torque plate fin arrangement to optimize the pitch angle for any given water speed.

The internal structure of the torque plate wing is composed of several different active and inactive elements, as shown in FIGS. 15a and 15b. FIGS. 15a and 15b show the torque plate wing of FIGS. 10 and 11 with the aerodynamic shell 210 removed. As shown in FIGS. 15a and 15b, just above the base fixture 190, a sleeve bearing 260 is used to support the bending and chordwise motions of the wing skin 210 and prevent it from interfering with the main spar 180. That is, when wing skin 210 is subjected to a twist or has a force applied thereto, the motion of wing skin 210 will impinge on sleeve bearing 260 so that wing skin 210 does not contact the actuator elements 170. When a voltage is applied to the active elements 170, a twist will be imparted to substrate plate 160 and thus to end plate 220, as shown in FIG. 16.

On top of the directionally attached elements 170 on each side of substrate plate 160 and attached to their underside are soldering leads 270. The soldering leads on the underside of the directionally attached elements 270 on the near side of substrate plate 160 are shown in dashed lines in FIG. 15a (and are not shown in the other figures for clarity). These soldering leads carry current to the directionally attached elements 170. The soldering leads 270 are connected to the wire leads 200 so that a voltage may be applied to control the torque plate wing in pitch. The soldering leads 270 may be wired in series or parallel with the directionally attached elements 170. Similar soldering leads 270 will be placed on the other side of substrate plate 160 and be connected to another set of wire leads 200, as shown in FIG. 15a (but which have not been shown in any other FIGS for clarity). Also, the individual directionally attached elements 170 may be wired up individually to achieve a high degree of twist and vibration control. This would lead to having not only two sets of wire leads 200 as shown in FIG. 15a, but to having many wire leads. There may be as many as two wire leads stemming from each individual active directionally attached 170 element. Further, only one set of wire leads 200 may be employed if the substrate plate 160 is conductive and grounded. Then, no underside soldering leads 270 will be requried, and the wire leads 200 will be connected to outer soldering leads 270 on opposite faces of the substrate plate 160. Further, any other technique of supplying a voltage to actuator elements 170 may be employed, FIG. 15a showing only one example of a method of supplying a voltage to actuator elements 170, and the further FIGS. show only two wire leads 200, just to indicate that some power supply system is needed.

Also, as shown in FIGS. 15a and 15b, a small portion of a soldering lead 270 is shown in the lower left-hand corner of FIGS. 15a and 15b. This small soldering lead portion 270 will supply electricity to the two lower most directionally attached elements 170, when the directionally attached elements 170 are, for example, electroplated actuator elements, such as electroplated piezoelectric elements. With such a construction, the electroplated directionally attached elements 170 will act as conductors to conduct electricity from the main soldering lead 270 to the small soldering lead 270. In this way, the small soldering lead portion 270 will be able to apply a current to the two bottom most connected active elements 170.

If the active elements 170 are piezoelectric or electrostrictive, then there will be one soldering lead on the underside and one on the top, as shown in FIG. 15a. If the active elements 170 are magnetostrictive, then the soldering leads will take the form of an electromagnetic coil which may partially or completely wrap around the active elements 170. The electromagnetic coil may also wrap around each individual active element 170 allowing it to expand or contract individually. If the active elements 170 were to be made from shape-memory or thermally responsive materials, like Nitinol TM or other shape-memory metal alloys, then there would be one soldering lead 270 at the leading edge of each active element 170 and another soldering lead at the trailing edge of each active element 170. When electricity would be applied, the shape-memory alloys or thermally responsive materials would be heated by their inherent resistivity or by the presence of a pyrotechnic or exothermal coating. This heating would lead to either an expansion or contraction of the elements which in turn would twist the torque wing plate.

Furthermore, as shown in FIGS. 15a and 15b, the directionally attached elements 170 are formed on both sides of the substrate plate 160. As apparent from FIG. 15a, the directionally attached elements 170 are formed on both sides of the substrate plate 160 at the same angle. As shown in FIG. 15b, the directionally attached elements 170 are formed on both sides of the substrate plate 160 at angles which differ by 90°. In the system shown in FIG. 15b in which the directionally attached elements 170 are mounted at angles which differ by 90°, a maximum twist in the substrate plate 160, and thereby in the wing, can be effectuated. Further, if these directionally attached elements 170 are mounted at an angle of +45° on the substrate plate 160 with respect to the longitudnal access of the substrate plate 160, a maximum twist can be induced in the substrate plate. In the embodiment shown on FIG. 15b, the directionally attached elements 170 will be formed at an angle of +45° on one side of the substrate plate 160 and an angle of −45° on the opposite side of the substrate plate 160 to achieve maximum twist.

One of the difficulties confronting the single actuator-plate configuration is that the torsional stiffness of the torque plate 160, 170 for large deflections is very low. This is because, to achieve high torsional deflections, the thickness of the substrate plate 160 and the actuator elements 170 must be made small. To make the stiffness of the torque plate 160, 170 greater, a number of individual torque plates 300, 310, 320 may be stacked together as shown in FIG. 17.

Figure 17:
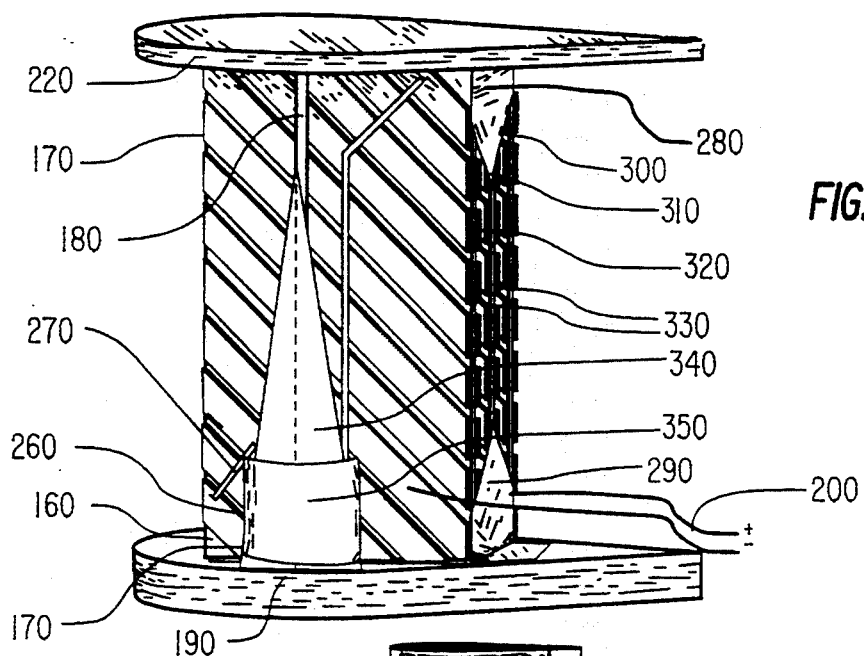
FIG. 17 shows a further torque plate wing structure according to the present invention.

In this structure shown in FIG. 17, joining the torque plates 300, 310, 320 together at their one tip is an end brace plate 280. There is also provided a corresponding root brace plate 290. The end brace plate 280 is rigidly joined to the end plate 220. However, the end brace plate 280 is allowed to rotate with respect to the planes of the torque plates 300, 310, 320. This rotation is facilitated by the use of shims 330, or thin tongues of material, which are strong in shear, but weak in bending at the juncture of the torque plates 300, 310, 320, and the end brace plate 280. That is, shims 330 are sheets of material which are placed between torque plates 300, 310, 320. Shims 330 act to prevent any of the directionally attached elements 170 of the torque plates 300, 310, 320 from contacting each other when these torque plates 300, 310, 320 twist. In this way, shims 330 will prevent the directionally attached elements 170 from two of the torque plates 300, 310, 320 from getting caught up with each other at the gaps between the directionally attached elements 170 and on the leads 200. This allows full rotation of the torque plates 300, 310, 320 without generating a helical shear flow around a closed section which would retard rotation.

The shear-promoting shims 330 may be made of materials like Teflon™, fiberglass and epoxy, nylon, Kevlar™, Lexan™, or any elastomeric bushing material. These shims 330 also act to absorb energy and damp out adverse vibrations so as to retard flutter. The shims 330 also act to provide dimensional stability to the torque plates of the torque plate stack as they slide over one-another. This damping material may have a very low friction coefficient (like Teflon™) so that an extremely fast response time may be maintained.

Each of the torque plates 300, 310, 320 will undergo a torsional deflection like that shown in FIG. 16. As they do, their roots will remain fixed and not move relative to each-other. However, the tips of the torque plates 300, 310, 320 will undergo an "orange crating" motion and slide over each-other. This "orange crating" motion results in the tips of the torque plates 300, 310, 320 remaining parallel to each-other as they are energized. However, if a quadrilateral figure were to be drawn around the torque plates as seen from their ends, the quadrilateral would no longer be a rectangle (as when torque plates 300, 310, 320 are not energized), but would form a rhombus.

In addition to the shear-promoting shims 330, a spar cap (or flange) 340 is bonded to the spar 180. This spar cap 340 provides higher bending stiffness with a negligible effect on the torsional stiffness of the torque plate stack. At the base of the spar cap 340 is a sleeve bearing 350. This sleeve bearing 350 is very similar to sleeving bearing 260 found in FIGS. 15 and 16, but it now also acts as part of the load-bearing structure of the spar 180 and the spar cap 340. The wing skin 210 may have a female counterpart on the inside of the wing skin 210 which fits the sleeve bearing 350 and allows freedom of torsional motions while resigning bending and chord-wise motions.

Figure 18:
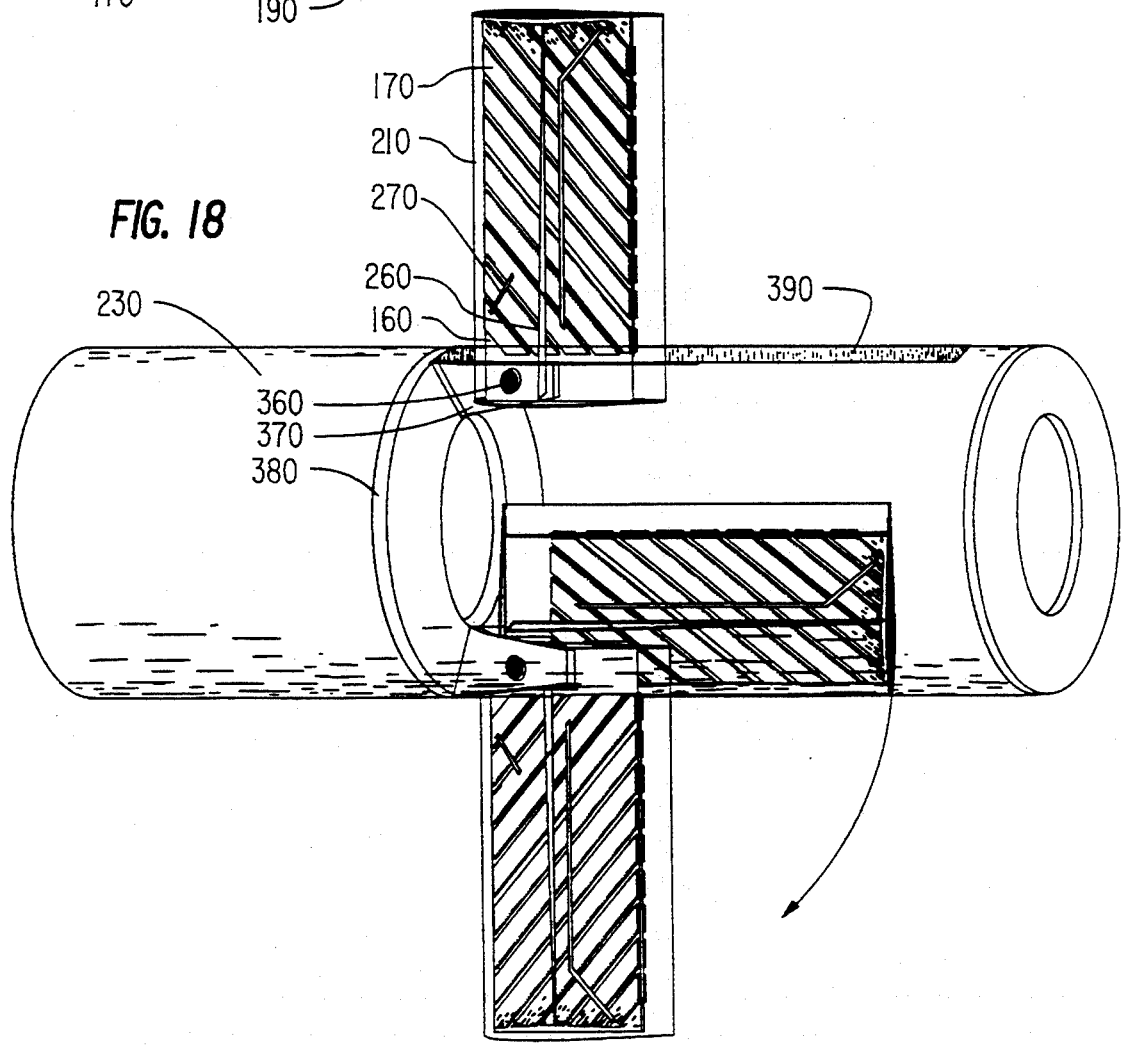
FIG. 18 shows a structure employing the torque plate wing according to the present invention.

To most efficiently apply the above-shown wing designs to vehicles, several fixtures may be made. As shown in FIG. 18, the wing may be stowed and a pivoting structure 360 and structural support 370 may be mounted to an internal structure like a bulkhead or frame 380. This allows flight loads to be transmitted to the vehicle structure 230. FIG. 18 shows a typical missile structure, but since the wing is applicable to any aerodynamic or hydrodynamic surface, the vehicle need not be a missile. To accommodate the stowed wing, a slot 390 could be made in the skin of the vehicle 230 through which the wing will pass. As shown in FIG. 18, there will be a deployment sequence from the stowed position for the wing to become effective. The actuator(s) that effect this deployment action may be a conventional electro-mechanical configuration or may use some sort of shape-memory alloy spring.

Figure 19:
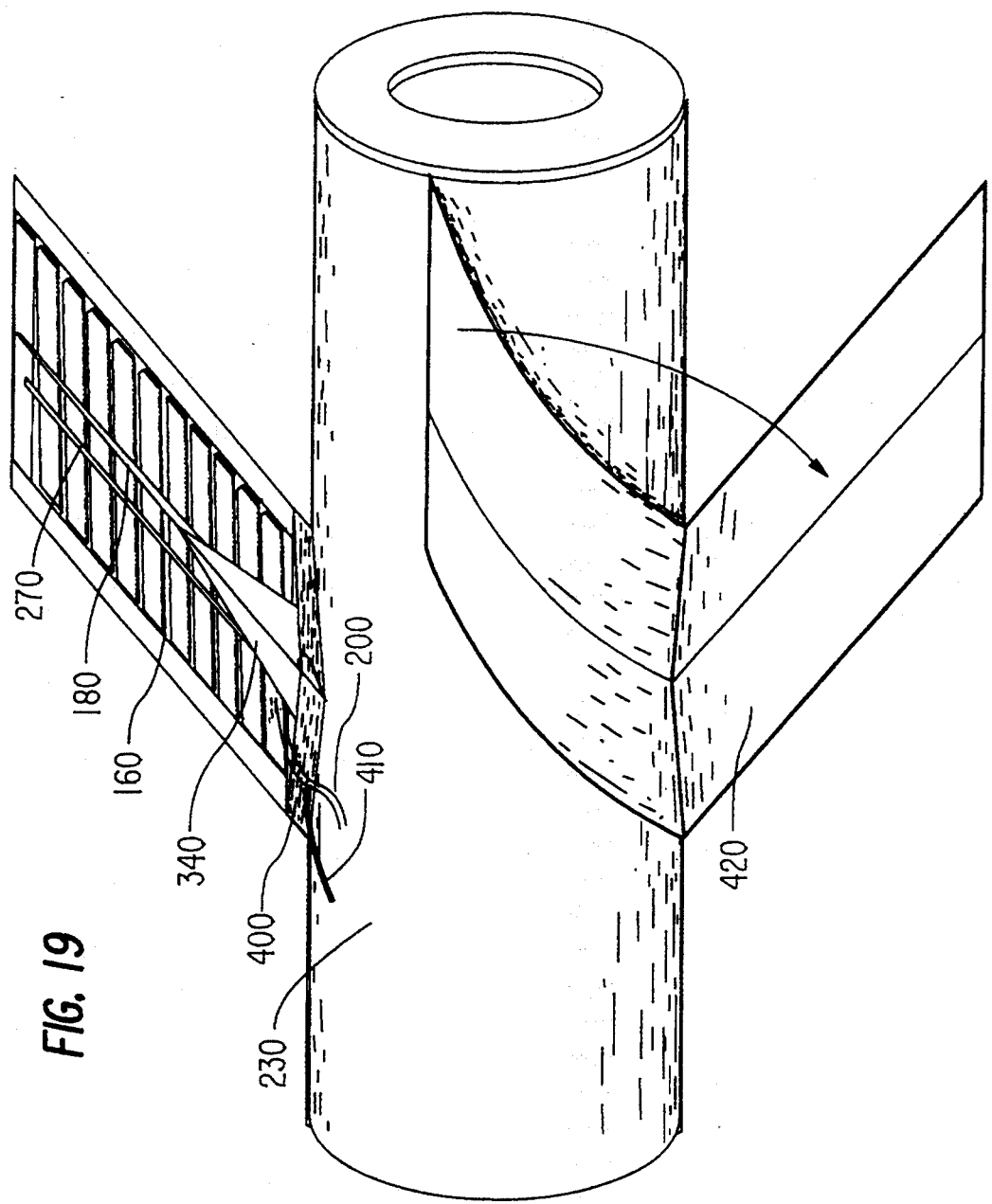
FIG. 19 shows a further structure employing the torque plate wing according to the present invention.

For many kinds of missiles, internal volume is at an extremely high premium. Accordingly, it is often advantageous to make a type of wing or fin that conformally wraps around the fuselage. To make a wing or fin that is capable of flight control as well as conformal stowage, a configuration as shown in FIG. 19 could be used. This configuration may use the one torque plate structure as shown in FIGS. 15 and 16, or may use a multitude of stacked torque plates as shown in FIG. 17.

Figure 15:
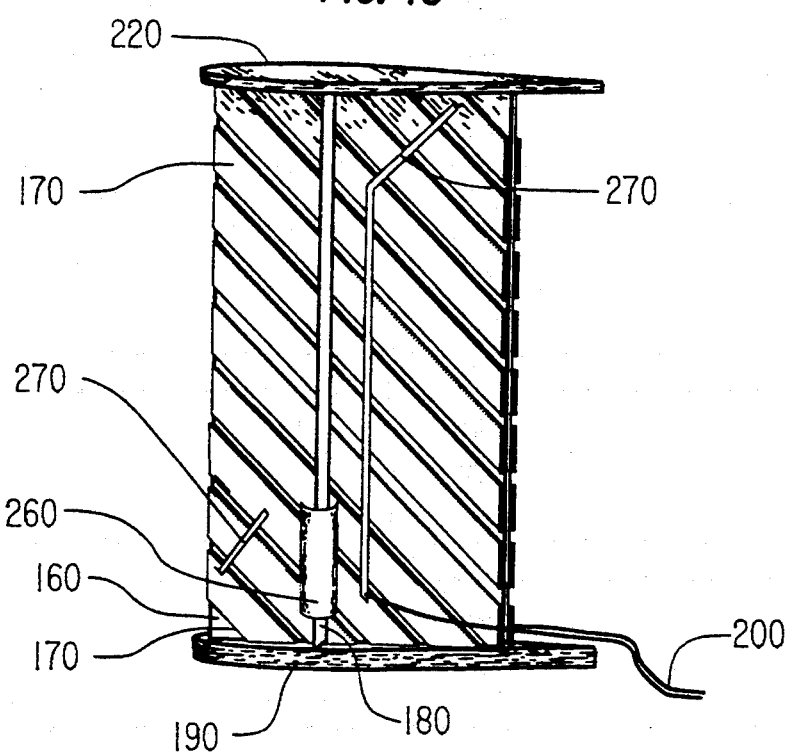
FIG. 15a show an internal structure of a torque plate wing according to one embodiment of the present invention.
FIG. 15b shows an internal structure of a torque plate wing according to a further embodiment of the present invention.
Figure 16:
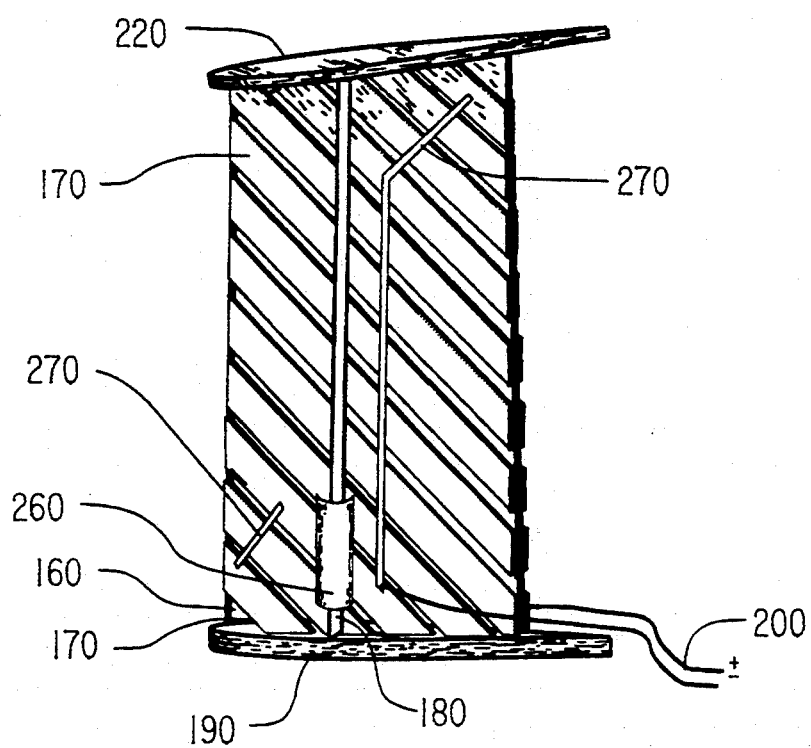
FIG. 16 shows the torque plate wing of FIG. 15 with a voltage applied imparted thereto.

As shown in FIG. 19, the torque plate is connected to the aerodynamic shell 230, but instead of being directly connected to a fixed base plate as in FIGS. 15, 16 and 17, the base plate may be made of a shape-memory-alloy (SMA) 400. This alloy is soft and flaccid (with a stiffness significantly less than aluminum) when cold. As the alloy becomes hotter, it moves to a "trained" shape and gains a stiffness approaching that of steel (for low strain rates). For deployment, the SMA base would be originally bent so that the wing was locally tangent to the fuselage. At the time of deployment, a high current charge is passed through an actuator lead 410 so as to heat the root attachment containing the SMA base 400. This heating will cause the SMA to assume its "trained" position and thereby deploy the wing. The actuator lead 410 may also trigger a pyrotechnic coating on the SMA root actuator 400 which would in turn deploy the wing 420, or may trigger an exothermal (noncombustive) reaction which, in turn, would heat the SMA root actuator.

As with the unswept wing configurations shown in FIGS. 15-18, aeroservoelastic tailoring may be achieved by appropriate positioning of the elastic axis (main spar 180) with respect to the aerodynamic wing shell. For swept-wing configurations, positive aeroservoelasticity may be obtained by using wing sweep as well. FIG. 19 shows an aft-swept wing 420 which tends to diminish active deflections.

Figure 20:
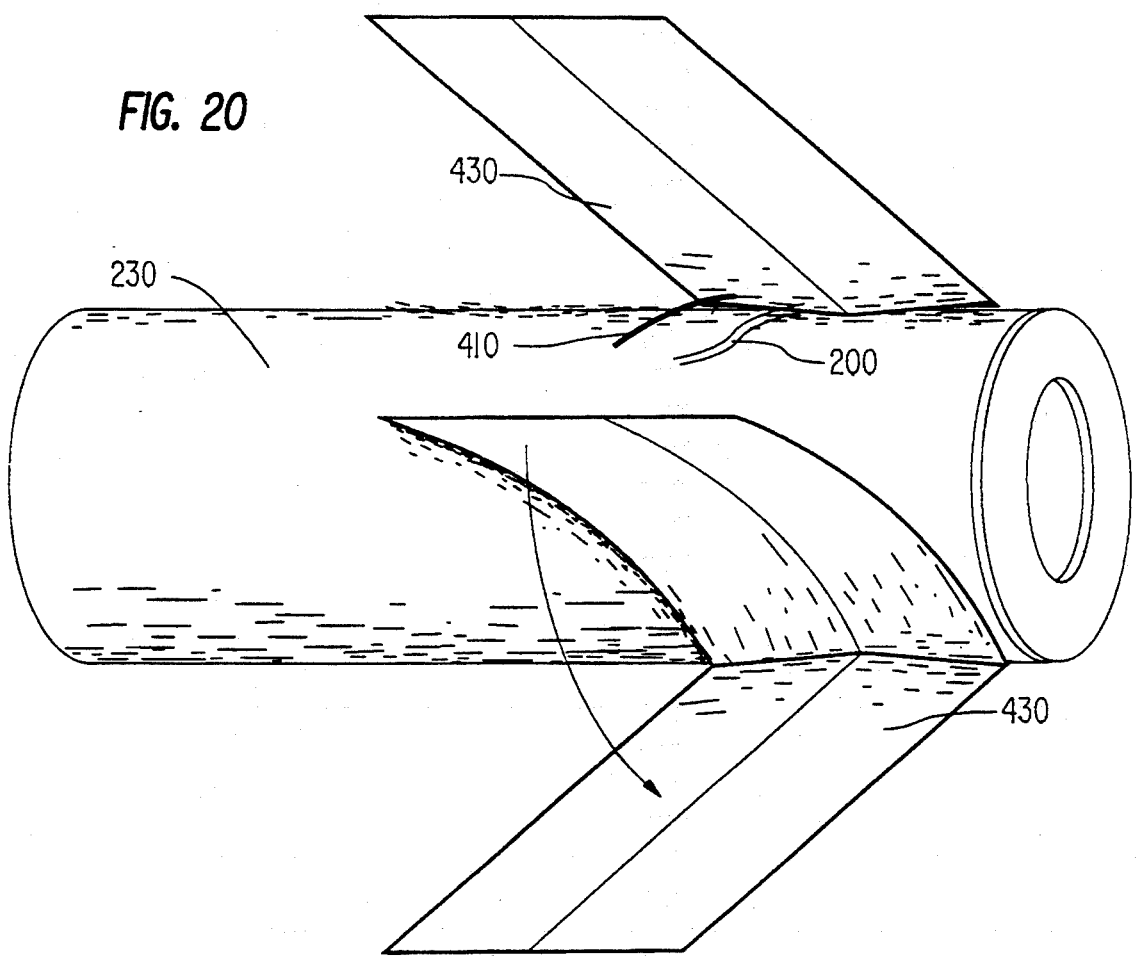
FIG. 20 shows a further structure employing the torque plate wing according to the present invention.

FIG. 20 shows a forward-swept wing 430 configuration which will magnify the wing deflections with increasing flight speed. This form of aeroservoelasticity may be explained with the following sequence. First, a control input is fed to the actuator elements through the power leads 200. This induces a twist deflection in the entire torque plate(s). This twist causes a pitch increase of the wing shell. The pitch increase causes an increase in air-loads which in-turn causes a bending motion. Since the wing is forward swept, the bending deflection translates to an increase in pitch which leads to greater air-loads and higher deflections. Eventually, the bending stiffness of the wing limits the deflection, but still, a relatively small active deflection of the torque plate(s) is magnified through active aeroservoelasticity.

Figure 21:
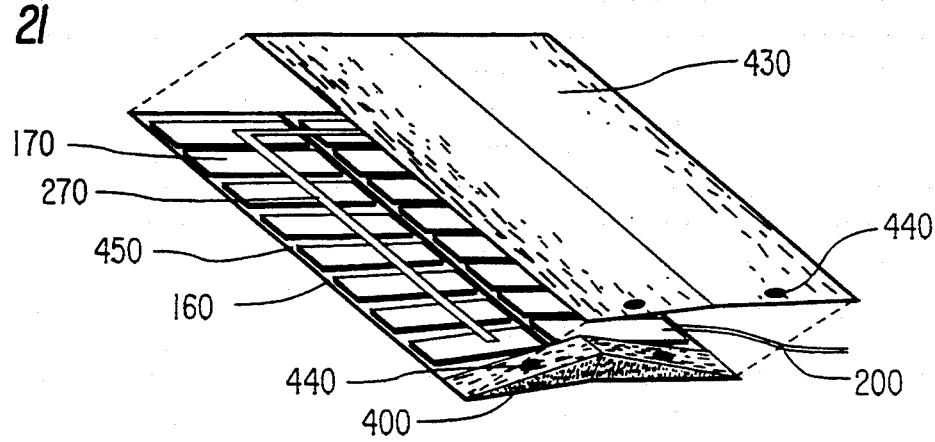
FIG. 21 shows a system of bonding directionally attached elements to a wing.

Another wing configuration using active elements is to bond the active elements on the underside of a sandwich skin wing as shown in FIG. 21. This sandwich-skin airfoil is amenable to supersonic airfoil configurations as they are thin, or diamond shaped. The breakdown of the wing configuration shows that the wing 430 has mounting locations 400 at its root for fastening to the vehicle to which it is attached. Within the closed section of the wing, a pyrotechnic coating 450 is used to facilitate deployment. The pyrotechnic coating 450 is placed against the outer skins which may be made of an SMA so as to be more amenable to conformal wrapping. As the pyrotechnic coating 450 is triggered, it releases hot gasses which may inflate the wing, causing it to deploy even faster, and remain rigid upon inflation. The hot gasses will circulate within the cavity and may be released through an excess pressure vent so as to prevent over pressure or rupture. This configuration may also use a launch sheath which wraps around the stowed fins and missile fuselage. This sheath may use a radar-absorbent-material (RAM) so as to further reduce the radar-cross-section of the missile.

As shown in FIG. 21, a plurality of active elements 17, which are directionally attached by using any of attachment techniques shown in FIGS. 1–5, are attached to substrate plate 160. Soldering leads 270 are attached to the directionally attached active elements 170, and leads 200 can provide a voltage to active elements 170.

In addition to missiles, other munitions may take advantage of active wings or fins using the torque plates of the present invention. The wings or fins may be either the torque-plate configuration or the sandwich-skin configuration. The types of munitions that may use these active fins or wings are numerous, but they include all classes of missiles and rockets, iron and smart bombs, artillery, mortar, rifle and pistol ammunition.

FIGS. 22a–22d show a typical round in the shape of an artillery round, or rifle bullet. The scale is not of importance, as the wings or fins can be made large or very small. The round is composed of a propellant section which has a starter cap 460. Within the shell casing 470, explosive propellant is contained. A slug portion 480 is the portion of the munition that travels to the target. The slug 480 contains several components, including a guidance section which has a seeker assembly 490, an electrical power section, and a warhead (if applicable).

Figure 22A:
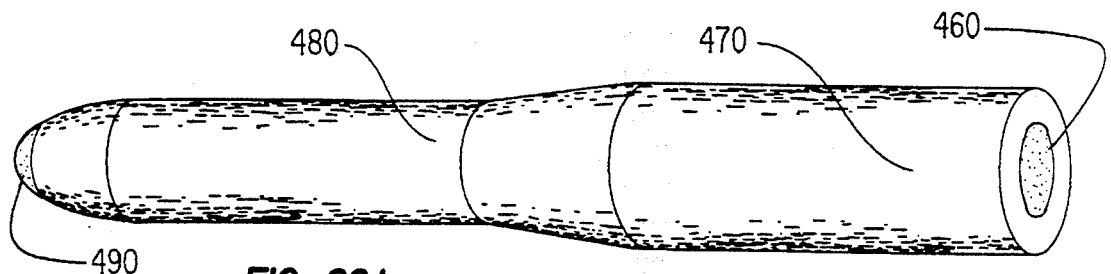
FIGS. 22a–22d show an embodiment of a projectile which has a torque plate wing employed therein.
Figure 22B:
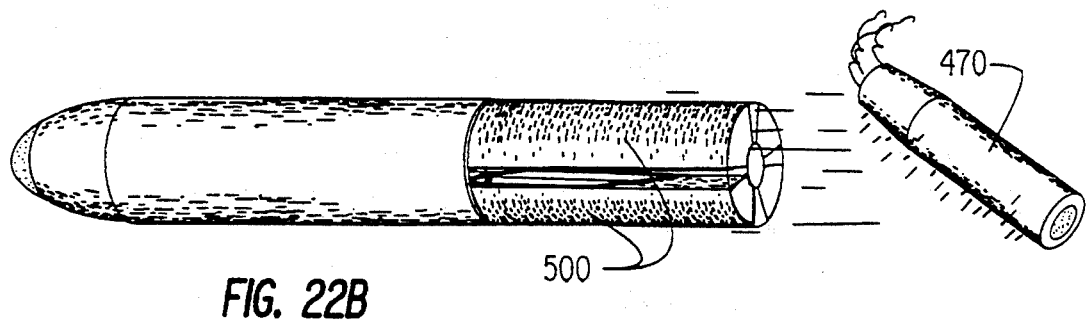
Figure 22C:
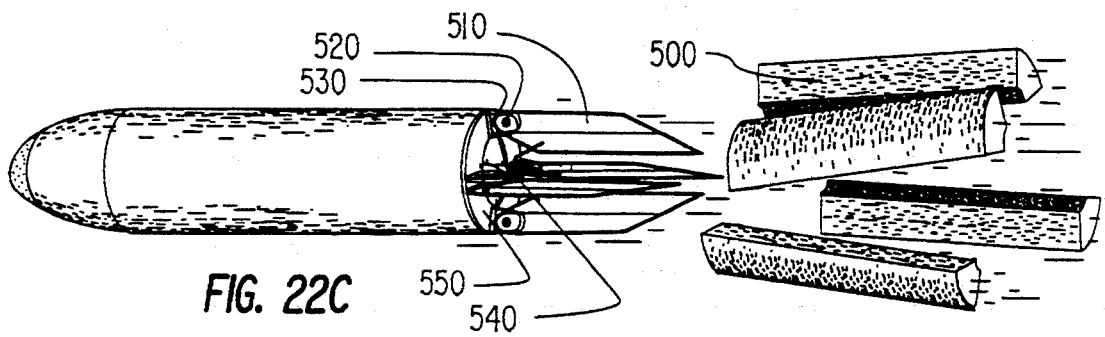
Figure 22D:
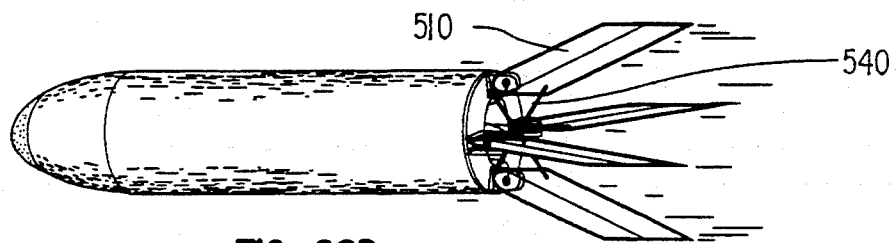

At the end of the munition, within shell casing 470, there are several protective caps 500, as shown in FIG. 22b, which transmit the explosive force to the base of the slug without damaging the fins 510. These fins 510 also have a pivot 520 and a base mount 530. To actuate the fins, a series of SMA wires 540 may be used. As the heat of the explosion reaches SMA wires 540, they spring out to their "trained" position and cause the fins 510 to spring out and enter the free airstream. The entire fin assembly is attached to the base of the slug with a bulkhead or frame 550. As the slug leaves the barrel, the protective caps 500, which are made of a stiff, light material like titanium, fall behind, and leave the fins 510 free to steer the slug to the target. The guidance may be one of many kinds. The most common guidance type involves the use of a laser designator which is used to illuminate a target. This laser designator creates a bright spot which may then be seen by the seeker assembly 490. Accordingly, the guidance section may control the fins to move to steer the projectile to its designated target.

Figure 23:
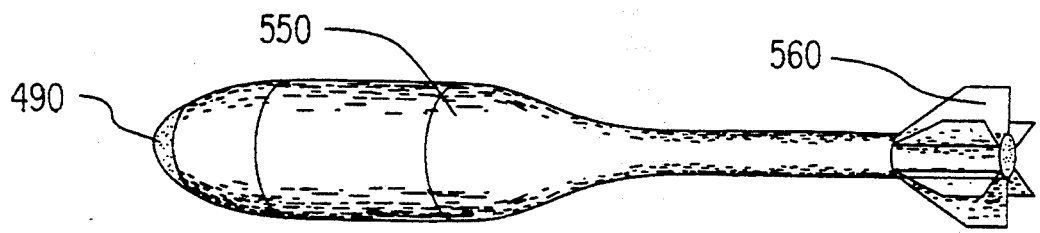
FIG. 23 shows a further embodiment of a projectile which has a torque plate wing employed therein.

Munitions of other configurations may also take advantage of the active sandwich or torque-plate wings or fins of the present invention. These munitions include mortar, rifle-launch, or bullet-trap grenades, such as is shown in FIG. 23. As shown in FIG. 23, fuselage 550 and seeker assembly 490 use a guidance network to steer the round. The fins of the round 560 either pitch in their entirety (as with torque-plate fins) or twist actively (as with sandwich fins) to achieve flight control.

Figure 24A:
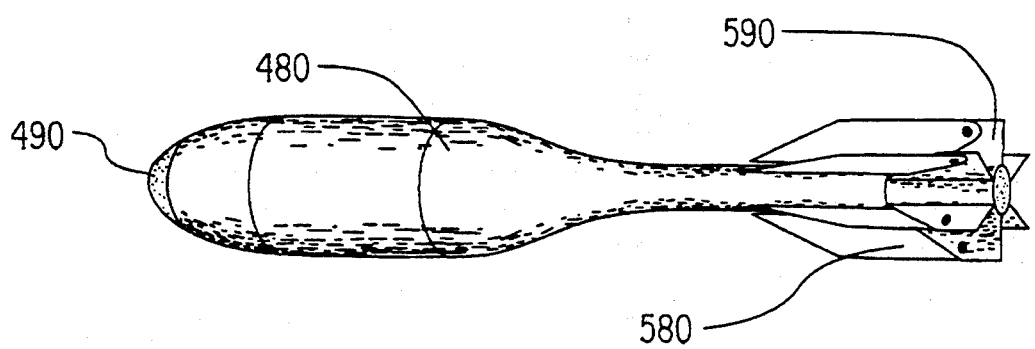
FIGS. 24a and 24b show a further embodiment of a projectile which has a torque plate wing employed therein.
Figure 24B:
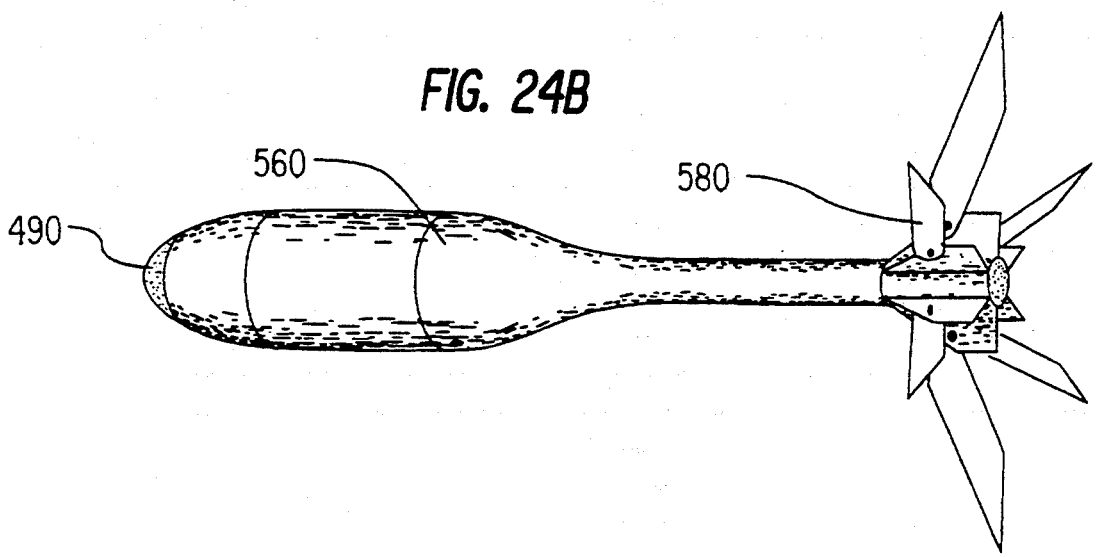

FIG. 24 shows another type of munition that uses hinged fins 590 attached to base fins 580. FIG. 24a shows the stowed position of the fins, prior to launch. This fin position will allow for a high degree of flight control with a small external diameter. After launch, the fins 580 fold out and take the shape of FIG. 24b. The flight control fins are connected to base fins 590 by pivots. Again, these fins 580 may be of the sandwich configuration, as shown in FIG. 21, or may be of the torque-plate wing or fin type, as shown in FIGS. 15–17. Since aerodynamic forces are sufficient for deployment, no actuator is needed, only a stop on the base fins 590.

Figure 25:
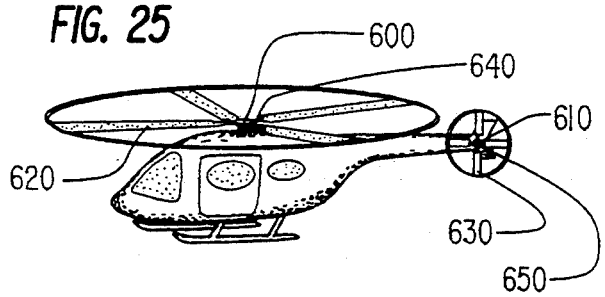
FIG. 25 shows a helicopter which may have directionally attached elements applied thereto.

In addition to munitions applications, helicopters and industrial fans may take advantage of the torque plate structures of the present invention. FIG. 25 shows a helicopter with a main rotor hub 600 and a tail rotor hub 610. Main rotor blades 620 are attached to the main rotor hub 600 and tail rotor blades 630 are attached to the tail rotor hub 610. Between the main rotor blades 620 and the rotor hub 600 is an active torque plate assembly 640. A similar assembly may be found on the tail rotor 650. This torque plate assembly may be composed of one active torque-plate as shown in FIG. 15, or may be composed of a multitude of stacked torque plates as shown in FIG. 17.

Figure 26:
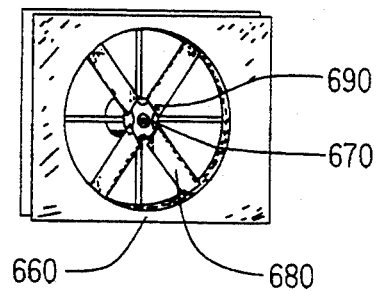
FIG. 26 shows a fan which may have directionally attached elements applied thereto.

Similarly, an industrial fan, shown in FIG. 26, may also use such torque plates. The fan housing 660 is attached to the hub 670 through the motor and struts. The blades 680 are similarly attached to the hub 670 by way of an active torque-plate assembly 690.

Figure 27:
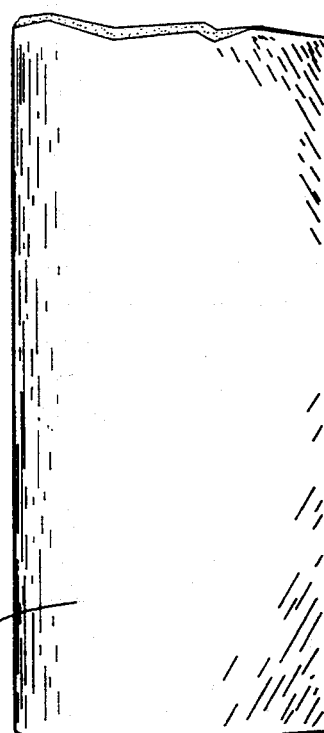
FIG. 27 shows the details of a fan blade structure having directionally attached elements applied thereto.
Figure 27:
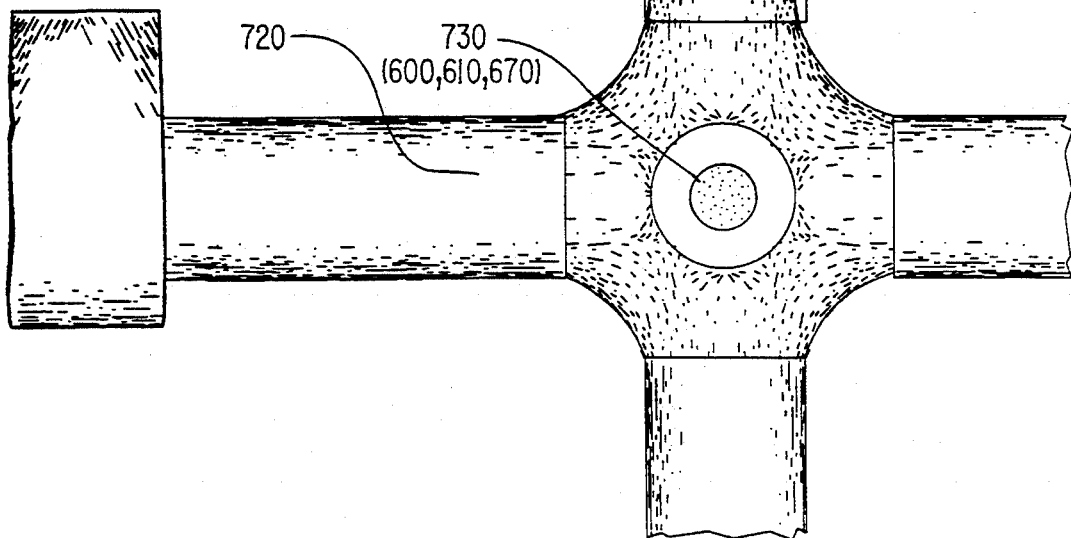

A close look at a generic hub arrangement sheds some light on the components. FIG. 27 shows the breakdown of the helicopter and fan parts. The blades 700 are the same as those shown in FIGS. 25 and 26 as 620, 630, 680. The torque-plate assembly 710 also corresponds to those shown in FIGS. 15–17. The torque-plate assembly functions as shown in FIG. 16, and accordingly provides a pitch deflection to each of the blades. The torque-plate assemblies are shielded within a torque-cuff 720 which protects them from the elements, maintains a low-drag profile, and allows unrestrained twisting motions. Both the cuff 720 and the torque-plate assemblies are joined to the hub 730 which corresponds to the hubs of FIGS. 25 and 26. The hub connects the rotor to the main shaft and transmits the forces and moments to the fuselage.

The torque plate structures as described above have each been described as employing directionally attached elements 170. However, it should be noted that actuator elements 170 need not be directionally attached elements but can be any type of actuator material. The types of actuator materials that can be used to actuate the torque plates shown in the present invention include piezoelectric elements such as conventionally attached actuator sheets, directionally attached elements, piezoceramic fiber composites and interdigitated electrode sheets. Piezoelectric polymers, magnetostrictive elements and shaped memory alloys can also be used. Further, electrostrictive materials including conventionally attached actuators, directionally attached actuators, electrostrictive fiber composites and interdigitated electrode sheets may also be used. Thus, the torque plate structure shown specifically with respect to FIGS. 10–27 may find applications with other than directionally attached elements.

Figure 28:
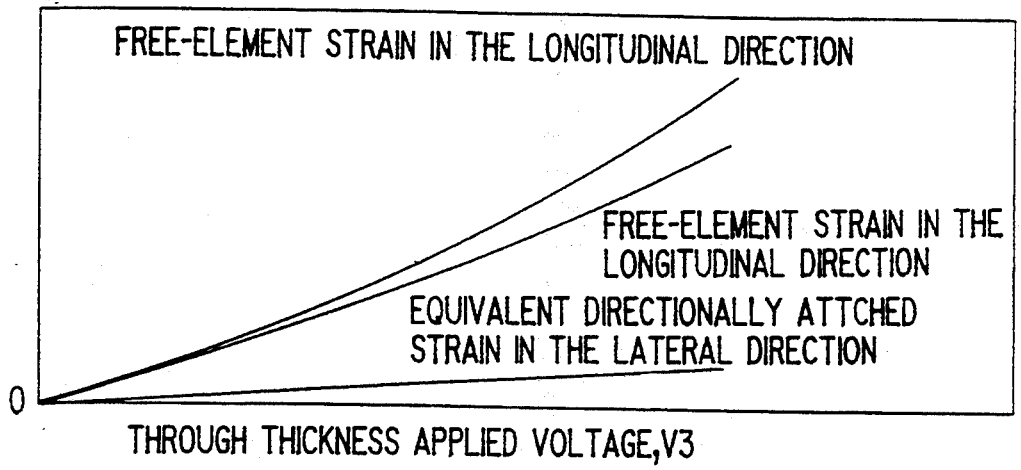
FIG. 28 shows characteristics of piezoelectric elements and electrorestrictive elements.
Figure 29:
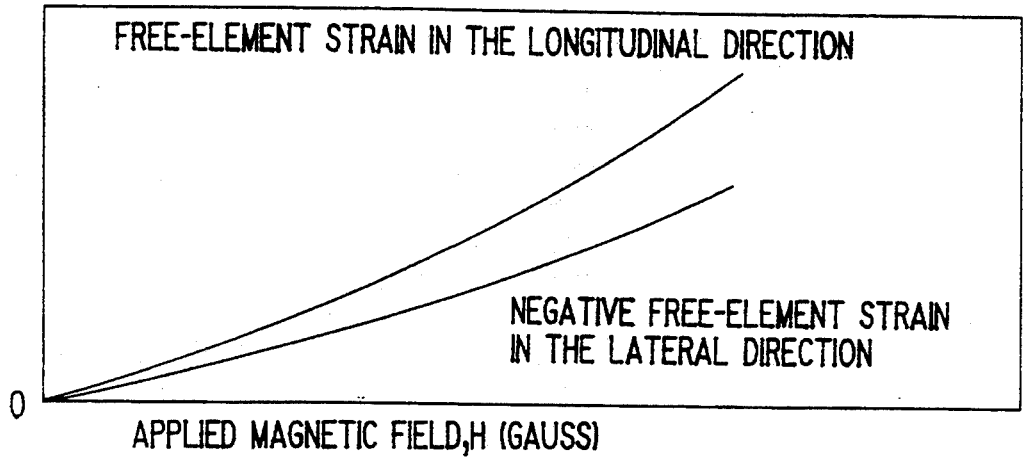
FIG. 29 shows the performance of a typical magnetoresistive element during actuation in one-direction.
Figure 30:
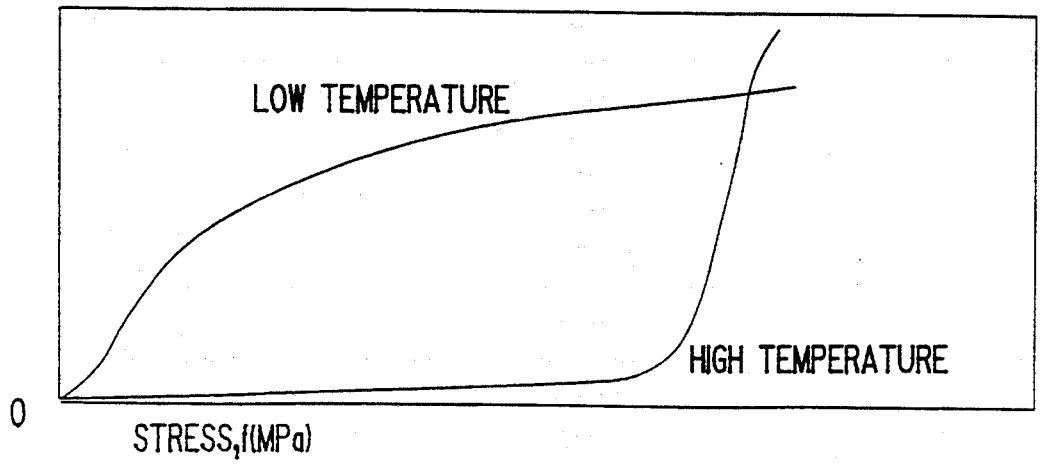
FIG. 30 shows typical characteristics of SMA actuators.

For high bandwidth flight control, all but the SMA elements are useful, as the break frequency of the SMA is far too low and the power consumption is far too high. The characteristics of piezoelectric elements and electrostrictive elements are similar and shown in FIG. 28. As the voltage across the faces of any active given element is increased, the active element free-strain is also increased. If directional attachment is used, then the lateral strain is decreased by as much as two orders of magnitude. This lends orthotropy to the active element which makes them amenable to torsional actuation. FIG. 29 shows the performance of a typical magnetostrictive element during actuation in one-direction. The lateral direction characteristically experiences contraction (negative strain), and accordingly, it too is useful for torsional actuation of plates and sandwich structures. For fin deployment, the SMA actuators are useful. Typical characteristics are shown in FIG. 30. As the element becomes warmer, it stiffens and moves toward a "trained" position. In the case of missiles, this "trained" position is that of a deployed fin. FIG. 30 shows that high temperatures can be used to actuate the fins, regardless of the source.

Obviously, numerous additional modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An actuator system, comprising:
a substrate having a bonding area flanked by opposed non-bonding areas;
at least one isotropic actuator element having transverse and longitudinal axes, and having a width and length wherein the length is longer than the width, said at least one actuator element having a bonding area flanked by opposed non-bonding areas;
a bonding agent attaching said bonding area of said actuator element directly to said bonding area of said substrate with the non-bonding areas of said actuating element facing opposed non-bonding areas of said substrate, whereby the stiffness of the actuator element differs in the transverse and longitudinal axes of said actuator element; and
means for actuating said actuator element to thereby impart a torosional deflection in said substrate.

2. The system according to claim 1, wherein said bonding area occupies only a central third of said actuator element.

3. The system according to claim 1, wherein said bonding agent extends along said longitudinal axis a selected length which is at least twice as long as a length of the bonding area of the actuator element along said transverse axis.

4. The system according to claim 1, wherein said actuator element has an aspect ratio greater than 10 to 1 and a thickness of the bonding agent is approximately equal to a thickness of the actuator element.

5. The system according to claim 1, wherein said actuator element comprises an element selected from the group consisting of piezoelectric, magnetostrictive, shape memory alloy and thermally actuated lamina elements.

6. The system according to claim 1, comprising:
a plurality of isotropic actuator elements each having a transverse axis and a longitudinal axis.

7. The system according to claim 1, wherein said plurality of actuator elements are aligned parallel to one another, at an angle of 0° to 90° to a selected orthogonal axis of said substrate and separated by at least 5 mil. from each other.

8. The system according to claim 7, further comprising:
a feedback loop for controlling said plurality of actuator elements.

9. The system according to claim 1, wherein the bonding area of the actuator element ranges from a central 1/5 to ¾ of the width of the actuator element.

10. The system according to claim 1, wherein the bonding area of the actuator element defines an inverse elliptical pattern on the actuator element.

11. In a method of actuating strains in a substrate having a bonding area flanked by opposed non-bonding areas, the improvement comprising the steps of:
providing at least one isotropic actuator element having transverse and longitudinal axes, and having a width and length wherein the length is longer than the width, said actuator element having a bonding area extending along said longitudinal axis and flanked by opposed non-bonding areas extending along said longitudinal axis;
attaching said bonding area of said actuator element directly to said bonding area of the substrate by a bonding agent with the opposed non-bonding areas of the actuator element facing the non-bonding areas of the substrate, whereby a stiffness of the actuator element differs in the transverse and longitudinal axes of said actuator element; and
actuating said at least one actuator element to thereby impart a torosional deflection in said substrate.

12. The method according to claim 11, wherein said step of attaching said actuator element to said substrate comprises:
attaching said actuator element to said substrate over only a central third of said actuator element.

13. The method according to claim 11, wherein said step of attaching said actuator element to said substrate comprises:
attaching said actuator element to said substrate at a selected length along said longitudinal axis which is at least twice as long as a length the actuator element is attached to the substrate along said transverse direction.

14. The method according to claim 11, wherein an aspect ratio of said actuator element is greater than 10 to 1 and a thickness of the bonding material is approximately equal to a thickness of the actuator element.

15. The method according to claim 11, wherein said actuator element is selected from the group consisting of piezoelectric, magnetostrictive, shape memory alloy and thermally actuated lamina elements.

16. The method according to claim 11, wherein said step of attaching said actuator element to said substrate comprises:

attaching a plurality of isotropic actuator elements to said substrate.

17. The method according to claim 16, wherein said step of attaching said plurality of actuator elements to said substrate comprises:

attaching said plurality of actuator elements in parallel to one another, at an angle of 0° to 90° to a selected orthogonal axis of said substrate and separated by at least 5 mil. from each other.

18. The method according to claim 17, further comprising the step of: controlling said plurality of actuator elements by a feedback loop.

19. The method according to claim 11, wherein the step of attaching said actuator element to said substrate comprises:

applying the bonding agent to the bonding area of the actuator element from a central 1/5 to ¾ of the width of the actuator element.

20. The method according to claim 11, wherein the step of attaching said actuator element to said substrate comprises:

applying the bonding agent to the bonding area of the actuator element in an inverse elliptical pattern.

* * * * *

UNITED STATES PATENT AND TRADEMARK OFFICE
CERTIFICATE OF CORRECTION

PATENT NO. : 5,440,193
DATED : August 8, 1995
INVENTOR(S) : Ronald M. BARRETT

It is certified that error appears in the above-indentified patent and that said Letters Patent is hereby corrected as shown below:

On the title page, Item [75], the inventorship should read:

--Ronald M. Barrett, Lawrence, Kan.--

Signed and Sealed this

Twenty-fourth Day of October, 1995

Attest:

BRUCE LEHMAN

Attesting Officer  Commissioner of Patents and Trademarks